United States Patent
Eidson et al.

(10) Patent No.: US 8,566,678 B2
(45) Date of Patent: Oct. 22, 2013

(54) BROADBAND SATELLITE SYSTEM FOR THE SIMULTANEOUS RECEPTION OF MULTIPLE CHANNELS USING SHARED ITERATIVE DECODER

(75) Inventors: Donald Brian Eidson, San Diego, CA (US); Arndt Joseph Mueller, San Diego, CA (US); Joseph B. Soriaga, San Diego, CA (US); Itzhak Gurantz, San Diego, CA (US)

(73) Assignee: Entropic Communications, Inc., San Diego, CA (US)

( * ) Notice: Subject to any disclaimer, the term of this patent is extended or adjusted under 35 U.S.C. 154(b) by 364 days.

(21) Appl. No.: 12/862,636

(22) Filed: Aug. 24, 2010

(65) Prior Publication Data

US 2011/0035647 A1 Feb. 10, 2011

Related U.S. Application Data

(63) Continuation of application No. 11/555,685, filed on Nov. 1, 2006, now Pat. No. 7,783,958.

(60) Provisional application No. 60/733,216, filed on Nov. 3, 2005.

(51) Int. Cl.
*H03M 13/00* (2006.01)

(52) U.S. Cl.
USPC .............. 714/780; 714/776; 455/452.1

(58) Field of Classification Search
USPC ............... 714/780, 776; 455/452.1
See application file for complete search history.

(56) References Cited

U.S. PATENT DOCUMENTS 6,182,264 B1 * 1/2001 Ott ............................... 714/774
7,437,166 B2 * 10/2008 Osseiran et al. ........... 455/452.1

* cited by examiner

*Primary Examiner* — Guy Lamarre
(74) *Attorney, Agent, or Firm* — Bruce Greenhaus; Richard Bachand; Sheppard Mullin Richter & Hampton LLP

(57) ABSTRACT

Multiple channels of received data are processed by a multiple channel demodulation and error correction decoding engine. The statistical uncertainty of processing channels with an iterative decoder are averaged across all the channels to reduce the total processing power required of the decoding engine compared to processing each channel with a separate engine. A set of input buffers holds blocks of data for each channel needing decoding. A quality measure is computed on each input block to set the priority and iteration allocation of decoding in the common decoder. The input RF signal is digitized by a broadband tuner that processes some or all of the channels to feed the multiple channel demodulator and decoder. Multiple decoded video data streams are output.

20 Claims, 21 Drawing Sheets

Bit Error Rate versus average Signal to Noise Ratio, when the Signal to Noise Ratio is normally distributed with 0.2 dB variance, parameterized by various decoding strategies including fixed iteration decoders and multiplexed decoder with various iteration pool capacity according to the present invention

BROADBAND SATELLITE SYSTEM FOR THE SIMULTANEOUS RECEPTION OF MULTIPLE CHANNELS USING SHARED ITERATIVE DECODER

RELATED APPLICATIONS

This application claims priority to U.S. Provisional Application No. 60/733,216 filed Nov. 3, 2005 entitled "Broadband Satellite System for the Simultaneous Reception of Multiple Channels", incorporated herein by reference. This application also claims priority to U.S. Pat. No. 7,783,958 issued on Aug. 24, 2010 entitled "Broadband satellite System for the Simultaneous Reception of Multiple Channels Using Shared Iterative Decoder", incorporated herein by reference.

FIELD OF THE DISCLOSURE

The present disclosure relates to satellite communications and demodulation and decoding of digital data.

BACKGROUND

The worldwide utilization of satellite communications for the reception of digital TV signals has grown at a rapid pace in the last 10 years. The utilization of digital video technology for Direct Broadcast Satellite ("DBS") systems allowed many folds increase in the number of video programs that can be transmitted over a single satellite and significantly accelerated the utilization of satellites for video transmission directly to the consumer both in the US and internationally.

A typical DBS home installation includes one or more dish antennae that receive signals from one or more broadcasting satellites. Some dishes support multi-satellite feeds and can receive signals from more than one satellite (usually satellites in adjacent orbital locations or at different frequency bands). In this typical installation, multiple Low Noise Block Converters (LNBs) accept the high radio frequency (RF) satellite signal feed, down covert the signals to an intermediate frequency (IF) signal, drive a multi-port RF switch, and the switch outputs are connected through cables to the various Set-Top Boxes (STBs) inside the house.

FIG. 1 shows a typical configuration where all the available and relevant satellite signals are presented at the multi-port switch inputs. Each STB in turn, selects the specific satellite signal it needs to view a desired program by monitoring an internal look-up table guide that lists the specific satellite, polarization and transponder required for reception of the program. A single transponder may carry several video programs. A satellite transponder signal is also called a channel. A control signal is sent by the STB to the switch through the connected cable to select the desired switch input that contains the desired program. Once a selection is made, the switch will make the input available on the cable for demodulation and decoding by the STB.

A typical DBS satellite carries two polarizations with 16 transponders each. Since each of the satellite polarizations provides 500 MHz bandwidth, the total bandwidth of a DBS satellite is around 1 GHz. This 1 GHz of bandwidth is typically configured in two primary ways. In one configuration, there are one or two outputs from the LNB; in the case of one output, only one polarization is selected by the STB and is provided to the LNB output, while in the case of two LNB outputs each LNB output carries a single polarization with bandwidth of about 500 MHz. FIG. 2 shows transponder frequencies for the case where there are two LNB outputs. Typically, the signals from the two polarizations are offset in frequency such that the center frequency of the transponders in one polarization falls in between transponder frequencies of the other polarization.

FIG. 3 shows a second configuration in which the two polarizations are "stacked" together. Signals are transmitted in the 950-2150 MHz band. Since a reasonably priced, long inter-facility link (IFL) cable may be able to carry less than 1.5 GHz of total bandwidth above 950 MHz, at most only two 500 MHz wide polarizations can be carried on the cable. Each of the 500 MHz signals can be from the same or different satellites. The frequencies from 0 to 760 MHz or 850 MHz are commonly used for over-the-air broadcast frequencies or for cable television.

The architecture needs to be significantly changed if a single cable STB is to be used for simultaneous reception of more than two programs. Since multiple programs can be sourced from different satellites and/or different polarizations, the total bandwidth required to receive all of the programs can be as much as 500 MHz for each simultaneously viewed program received. This can easily exceed the tuning bandwidth available on a single IFL cable. In fact, it could be as high as the total bandwidth of all the satellites. This problem becomes more significant with an increase in the deployment of Digital Video Recorders (DVRs). The ability to record multiple programs simultaneously is important for satellite operators, since it can make up for their inability to offer true Video on Demand (VOD) services as offered by competitors, such as cable operators. The ability to simultaneously record multiple programs provides the user with an effective time shifting alternative to VOD. Thus, it is quite advantageous for satellite operators to be able to provide a STB with several channel receivers, thus enabling the user to watch one program while simultaneously recording several other programs. Alternatively, an architecture can be provided in which a "Media Center" STB with multiple receiver feeds can provide multimedia programming, such as video and audio programming, to multiple "Thin Client" STBs in other rooms using home networking technology for the transmission of the selected programming.

More recently, new satellite switches have been developed that can place transponder channels from several connected satellites and polarizations into a single IFL cable.

FIG. 4 shows a system in which a single STB connected to an outdoor unit (ODU) by a single IFL cable receives programs from two or more separate satellites simultaneously. This enables an STB connected by a single cable to employ two or more tuners and have simultaneous access to multiple programs, independent of how many satellites are being received. This is useful, since the STB may serve two TV sets simultaneously. Alternatively, it enables the user to watch one program while a second program received through any of the connected satellites is recorded.

In order to receive multiple simultaneous programs from multiple satellites in a STB with a single IFL cable, additional processing of the signals from the various LNBs is performed. Transponder signals are selected from the LNB outputs and combined into a composite signal to enable all the desired channels requested by the various STBs to be processed and provided on the single IFL cable. More than a single IFL cable can be utilized if necessary, whereas the necessary channels are delivered to the corresponding STBs connected to each cable.

There are several alternative options that can be considered but all deal with extracting portions of the traditional satellite full-polarization signal to be transmitted through the IFL cable. Following is a short discussion of the alternatives:

1. For each of the desired programs, extracting a portion of the signal from the LNB that includes the transponder carrying the program. Then constructing an equivalent IFL signal that includes all the newly extracted signals that carry all the desired programs. In this fashion, assuming that one does not need to perform any signal demodulation, the minimum signal section that is required to carry a given program is a single bandwidth section that carries the desired program, which is a transponder channel. Assuming an IFL capable of carrying the traditional 950-2150 MHz bandwidth, as many as 32 arbitrary programs from multiple satellites can be received simultaneously. The outdoor device performs the function of selecting sections of multiple satellite polarizations and reconstructing a new signal for transmission to the indoor unit is called generically a Frequency Translating Module (FTM). The FTM can be constructed in many configurations. In one such configuration a device selects several desired transponder channels and reconstructs these channels into a certain span of bandwidth (usually in the 950-2150 MHz band) for input to the STBs.
2. Other alternatives that can carry even more programs exist, but may require more elaborate signal processing to be performed in the ODU. In this case, the digital video and audio signals of the desired program are extracted from the corresponding transponders and transmitted to the STBs for storage, viewing or additional processing, including storage in other devices. The aggregate signals that include all the digital video and audio signals of the selected program can be carried in several forms. These include various forms of modulation different than the original modulation (denoted trans-modulation). Alternatively, the various digital video signals of the selected programs are re-multiplexed and re-modulated in a fashion similar to the original signals and then received by the same STBs that receive the original signals. These signals can be delivered as digital signals over some networking technology using a protocol such as Ethernet or another.

Once all the selected transponder channel signals have been re-arranged to fit in a single cable, it enables another highly beneficial option. Since all these transponders have been selected based on user requirements, it is assumed that all, or at least most of them are arranged in a contiguous fashion in the frequency domain. Hence, all the channels that need to be demodulated are available in a certain section of bandwidth that can be fit within the bandwidth carrying capability of a single cable. Hence, these channels can be demodulated simultaneously utilizing a new broadband demodulator front-end described below.

Traditional multi-channel DBS system reception requires the selection of the desired programs and the corresponding one or more transponder channels that carry these programs to be demodulated simultaneously. However, since the selected programs are arbitrary, the corresponding transponder channels can be at arbitrary frequencies, transmitted from arbitrary satellites (in a multiple satellite system) and at arbitrary polarization.

In the traditional method, a transponder channel is received from a selected satellite and a selected polarization, and a separate tuner/demodulator receives the transponder channel frequency and demodulates it. Hence, such methods require a separate tuner and demodulator for each demodulated transponder channel. In addition, such methods require the duplication of the signal processing needed for demodulating and decoding all the channels.

If, however, all the required transponder channels are available in a certain range of frequencies at a given polarization, then it is possible to utilize a single broadband tuner to select and down convert the corresponding section of bandwidth. This can be done before the analog to digital (A/D) conversion process used by the digital demodulator(s). One example is the case discussed above where the system organizes all the transponder channels that require demodulation to be available in a particular section of bandwidth. This would also allow the demodulator(s) to use a broadband front-end to digitize the entire section of bandwidth. The demodulators would perform the remaining demodulation and signal processing in the digital domain. Such an architecture could be more efficient than an architecture that uses multiple simultaneous demodulators.

FIG. 5 shows a multiple demodulator architecture used in some existing satellite STBs. In this implementation, RF signals from one or more cables in the 950-2150 MHz range are provided as input to multiple tuners. Depending on system configuration, the RF input signals to the tuners can be the same to all tuners. Alternatively, they can be different to each tuner. In yet another alternative, they can be any other configuration where the RF input to some of the tuners is the same. Each of the tuners tunes to the transponder frequency that contains the desired video channel. The tuners provides I and Q baseband components to the demodulator/decoder for demodulating, decoding and data extraction. The data is provided to the transport stream for decoding, conditional access decryption and MPEG decoding. This architecture is very flexible. It can receive and decode any channel from any satellite, polarization and transponder, assuming that the system can provide access to all satellites and polarizations (through the utilization of an appropriate outdoor switch).

FIG. 6 shows a block diagram of a prior art tuner, such as one of those shown in FIG. 5. In this block diagram, a single conversion tuner is shown. The RF input signal is amplified by a front-end low noise amplifier (LNA) with gain and gain control. The gain control is needed to compensate for the potential large dynamic range that can be encountered due to different IFL cable attenuations and LNB gain. The RF signal is split and then down-converted by a Quadrature down-converter. The down converted components, designated as I and Q, are each filtered by a baseband filter. They are then amplified by a baseband Automatic Gain Control (AGC). The output is then provided to a demodulator/decoder. The whole process is generally controlled by a controller. The controller selects the synthesizer frequency (mostly as a function of user channel selection). In addition, the controller, adjusts the RF AGC levels. If necessary, the AGC can be an independent function as well or in combination with the controller. The controller also adjusts the baseband filter bandwidth.

FIG. 7 shows the spectrum of the signals of FIG. 6. One of the transponder channels (Ch k) is selected for demodulation by the controller. This allows viewing of one or more of the digital video signals transmitted in this transponder channel. The synthesizer is tuned to the center frequency of Ch k. The quadrature down-converter down converts the Ch k signal to the two baseband components, Ch k-I and Ch k-Q centered at 0 Hz or another low frequency. The low pass I and Q filters filter the down-converted I and Q signals. The signals are amplified appropriately by fixed or variable gain amplifiers. The amplifiers pass the signals to the demodulator/decoder for additional processing needed to extract the desired digital video channel.

The main functions performed after the down conversion and digitization of the I and Q signals are the demodulation of the transponder signal and performing the Forward Error Correction (FEC) decoding. Various techniques of demodulation and FEC decoding are well known and are widely discussed in numerous books and technical literature. For example, "Digital Communications" by John Proakis, published by McGraw Hill series in Electrical and Computer Engineering, discusses extensively various techniques for demodulating and decoding digital communication signals.

Error correction coding and decoding is needed for the transmission and reception of digital video signals. To conserve transmitter power and reduce the size of the receiving antenna dish, the links are being operated with low Signal to Noise Ratio (SNR) margins and non-zero raw bit error rates (BER). Digital video requires near error free data to avoid visible impairments to the viewed program. Corrected error rates of 1 bit in a billion (1e-9), or better, are typically needed to result in a satisfactory video image. Compression of the digital data increases the need for error free data. Well-known FEC techniques are used to assure error free communication in the noisy channel. Redundancy or check bits are added to the transmitted video data then used to correct errors in the data in the receiver. In satellite systems, such as the one specified by the Digital Video Broadcasting for Satellite (DVB-S1) standard, error-correcting block codes such as Reed-Solomon (RS) codes are used in conjunction with convolutional codes. In this concatenated coding approach, the RS code is the outer code and the convolutional code is the inner code. A two stage decoding process is done in the receiver.

More powerful FEC techniques such as turbo code or low density parity check (LDPC) code FEC can be applied to satellite communication transmission techniques to further improve BER at a given power level or reduce power requirements while maintaining the same BER as other FEC approaches.

Turbo and LDPC codes have a disadvantage of high decoding complexity. Turbo and LDPC decoders operate iteratively on the received data block to correct errors and the number of iterations required to decode the data is not known with certainty until the decoding process is complete. A system must have sufficient processing power to iteratively decode the data under worst-case expected conditions. The decoder power needed for the worst-case condition is higher than the average requirement.

A system may include a large buffer for a single stream of data of incoming data followed by a single iterative decoder. While the decoder is operating on a block taking longer than average, the buffer stores incoming data. This allows some averaging of processing demands on a single stream of data over time, at the expense of latency and large buffer capacity.

FIG. 8 shows a simplified block diagram of a typical iterative decoder. The decoder receives soft decision bits from the corresponding demodulator and buffers the information for processing. An iterative decoding unit processes the input information and extracts relevant information, which is stored in an auxiliary buffer. The decoder then utilizes the processed information and the original stored soft decision to start a new decoding iteration. The iterative-decoding of low-density parity-check codes is typically halted after a valid codeword is found, or after a maximum number of iterations have been completed.

The prior art approaches to processing multiple channels of digital video data rely on separate error correction units for each channel. Each decoder needs processing power equal to the worst-case requirement. A need exists for efficient processing of several transponder channels in a STB.

SUMMARY

Multiple channels in a section of bandwidth are demodulated with a multi-channel demodulator. The signal output from the multi-channel demodulator is decoded with an iterative decoder. The decoder is shared among all of the channels being decoded. By sharing a common decoding resource, processing capacity can be allocated across all the channels to optimize the use of the decoding resource. A quality measure calculated on each channel influences the decoding process. In particular, in one embodiment, the quality measure is used to determine the priority among channels and whether some channels can be excluded. In another embodiment, the quality measure also determines the number of iterations to be "reserved" for each channel and maximum number of iterations allocated to each channel. The uncertainty associated with processing the individual channels is averaged to reduce the overall uncertainty of processing all of the channels.

In one embodiment, the section of bandwidth is digitized prior to processing. In accordance with some of the embodiments disclosed herein, processing the multiple channels in the manner disclosed results in savings and benefits. One embodiment of the disclosed method and apparatus consists of the following elements:

1. Using a single broadband tuner front-end as compared to the multiple tuners required in the traditional approach.
2. Using a single Analog Front End (AFE) that includes a single or dual, high-speed analog to digital converter (A/Ds) to digitize the broadband signal. One alternative embodiment uses several A/Ds to digitize the broadband signal, if the required bandwidth is wider than can be done with a cost effective A/D. Such an AFE may be more efficient then the case in which each demodulator requires a separate AFE.
3. Including an AFE (or several AFEs) and multiple demodulators/decoders in a single package. This saves several packages and I/O pins.
4. Using efficient, simultaneous, multi-channel demodulation. This reduces the complexity when compared to multiple, single channel demodulations.
5. Using multiplexed (shared decoding resource) decoding of multiple channels. This saves a significant amount of complexity, especially when utilizing iterative decoding such as Turbo decoders or Low Density Parity Check (LDPC) decoders.

Sharing the decoding of multiple simultaneous data streams, each of which uses an iterative decoding scheme, such as turbo decoding and/or LDPC decoding, enables an efficient decoding due to the statistical nature of the decoding process. The amount of required decoder processing varies from channel to channel. In addition, the processing varies over time for each channel. These variations produce uncertainty and variability in the number of decoding iterations needed. A single decoder requires a processing engine that is sufficiently powerful to process the worst-case situation. That is, the processing engine needs to be able to perform a sufficiently large number of iterations to achieve the desired level of accuracy. However, due to the statistical nature of the decoding process, at a given Signal to Noise Ratio (SNR), decoding of each channel is largely independent and requires an independent number of iterations to achieve the desired result. A single decoder that decodes all the streams can take advantage of this independence. Using a single decoder results in an average decoding load across all streams. This results in a processing efficiency improvement of 30-50% when compared to the complex architecture required for multiple decoders offering the same performance level.

The advantage of using efficient decoding of multiple, simultaneous data streams is enhanced significantly when those data streams belong to channels with different signal to noise ratios, as is likely the case for typical satellite communications. In one embodiment, the different channels are transmitted by different transponders on different satellites and at different polarizations. Accordingly, even in the most controlled environment, it is very unlikely that the signal to noise ratio (SNR) of the various channels (typically a channel is a transponder) will be maintained to within 1-2 dB of each other.

As will be shown in the following section, the number of iterations required to achieve a given Bit Error Rate (BER) is significantly impacted by the operating signal to noise ratio. That is, the amount of processing required to decode a turbo code or an LDPC code data stream is a function of operating SNR. SNR levels above an upper threshold require little processing to achieve a nearly error free performance. However, a very small decrease in the SNR (e.g., in the range of 0.5-0.8 dB) can change the amount of processing (as represented by the number of iterations consumed by an iterative decoder) required to achieve very low bit error rate (BER). The increase can be several times that consumed by channels operating at a higher SNR. Furthermore, when the channel SNR falls below a lower threshold, no amount of processing can recover the data. Hence, processing is wasted if continued. Therefore, it is much more efficient to direct the processing resources at decoding the streams that can most effectively utilize processing resources at any given time. When the SNR of all the channels is significantly above the upper threshold, as is the case in clear skies, relatively little processing is required to achieve the desired BER performance. When the power in one channel fades, it is very likely that only one or two other channels at a time fall into the limited SNR band where additional processing can achieve the effective reduction of BER. As the fade increases, different channels may fall into this SNR band where processing is beneficial, while other channels may fall below the lower threshold, where no processing should be performed.

A multi-channel tuner/demodulator/decoder according to the disclosed method and apparatus can significantly reduce the complexity and the cost of a multi-channel satellite. The cost of the front-ends in such systems can also be reduced compared to traditional implementations that duplicate the demodulation/decoding process for each channel. Significant efficiency can be gained from the aggregate, multiplexed decoding of multiple channels. Hybrid schemes are also possible where some, but not all of the techniques and processing described above and below are performed to improve efficiency. Such hybrid schemes may be useful in cases in which, due to various limitations, the full utilization of all of the steps highlighted in the present document are not possible. Alternatively, full utilization may not be cost effective, may not meet certain operation models and scenarios, there may be technology limitations, or such full utilization may not be cost effective. In any of these cases, the use of a hybrid scheme may be desirable.

DETAILED DESCRIPTION

The following sections describe various techniques to achieve an efficient, multiple channel receiver.

Figure 9:
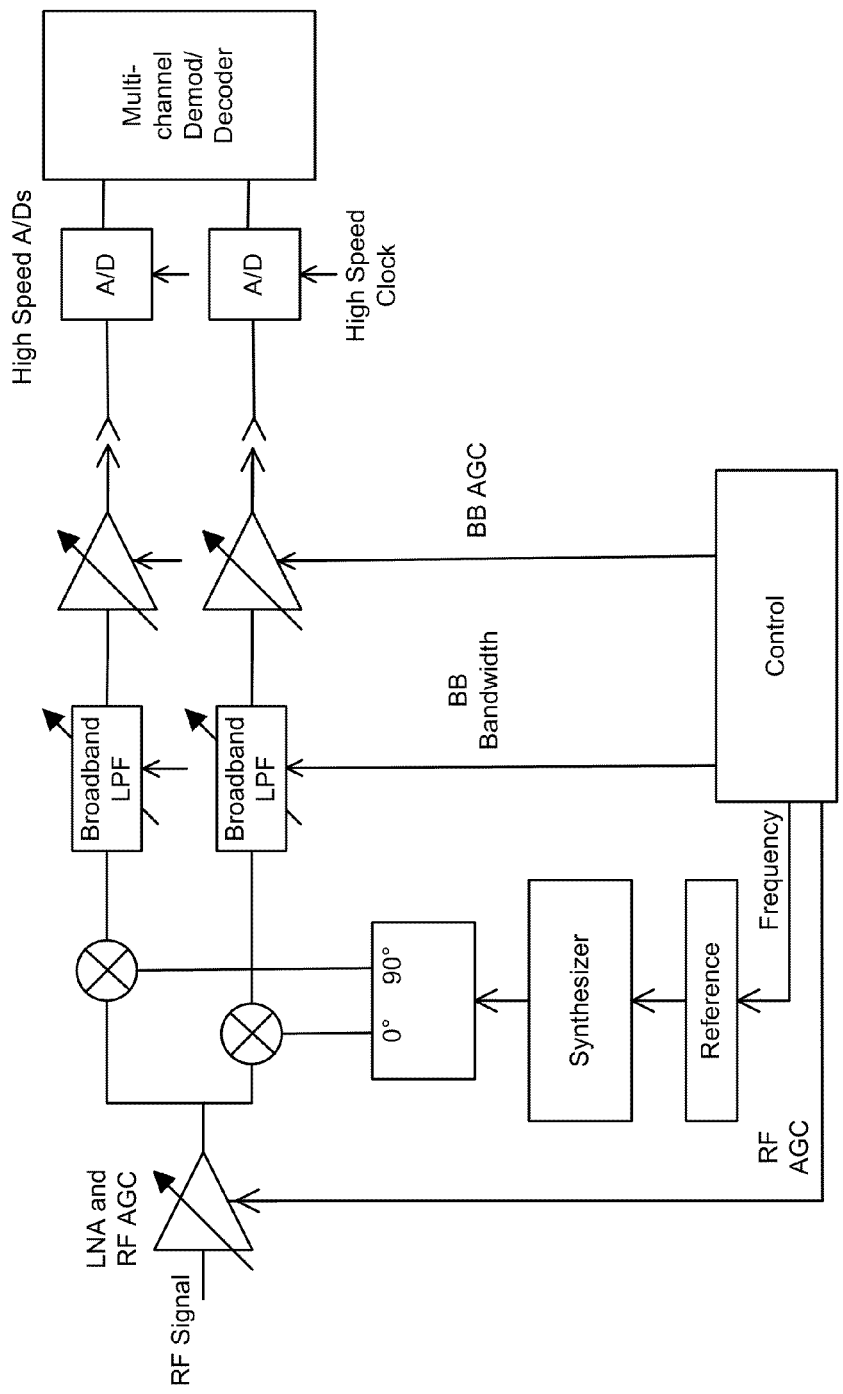
FIG. 9 shows a broadband tuner and demodulator and decoder for demodulating and decoding multiple channels according to the disclosed method and apparatus.

FIG. 9 shows a method for demodulating multiple transponder coded channels. Each such coded channel has error correction coding. In this scheme, all the desired transponder channels to be demodulated from all the relevant satellites and polarizations are contained in a limited section of the frequency spectrum. The frequency conversion of the desired signals to a given section of the frequency spectrum can be performed by a Frequency Translation Module (FTM). The desired signals are transmitted by selected transponders on arbitrary frequencies used by the satellites carrying those transponders. The FTM may also be known as a signal selector and combiner. The FTM is typically located in the outdoor unit (ODU). An example system is described in U.S. Pat. No. 7,130,576, entitled "Signal selector and combiner for broadband content distribution" issued on Oct. 31, 2006.

The FTM accepts commands from the one or more set-top boxes (STBs) for the selection of the desired transponder channels. The FTM then translates these transponder channel signals to a contiguous section of the frequency spectrum or arranges them in another frequency band configuration that can be provided to the indoor units over a single inter-facility link (IFL) or multiple IFL cables. Accordingly, the frequency translated transponder channel signals do not necessarily have to be in a contiguous frequency band or even on the same IFL cable (since the system can support more than one IFL cable).

Figure 1:
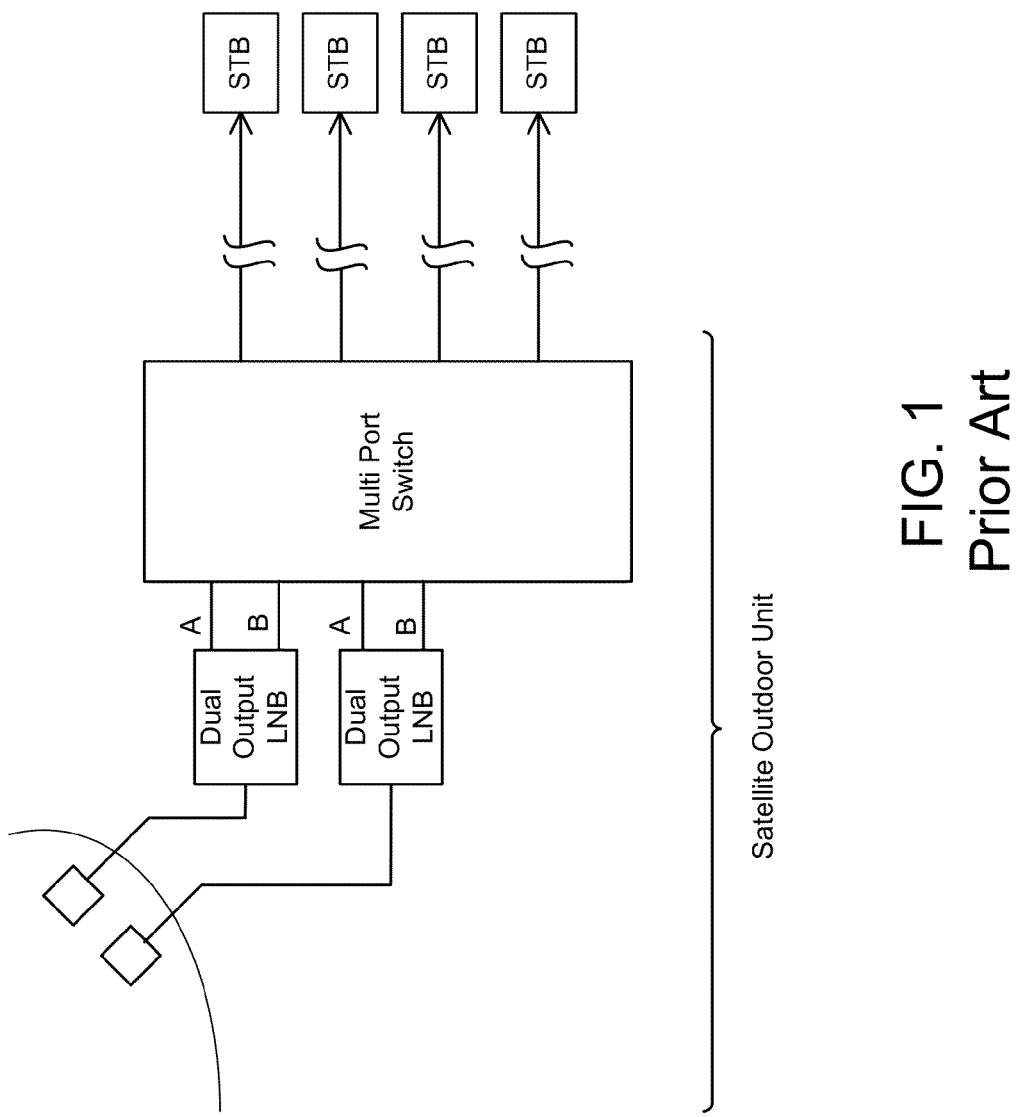
FIGS. 1-5 show prior art configurations of satellite receiving systems, signal distribution, and processing.
Figure 2:
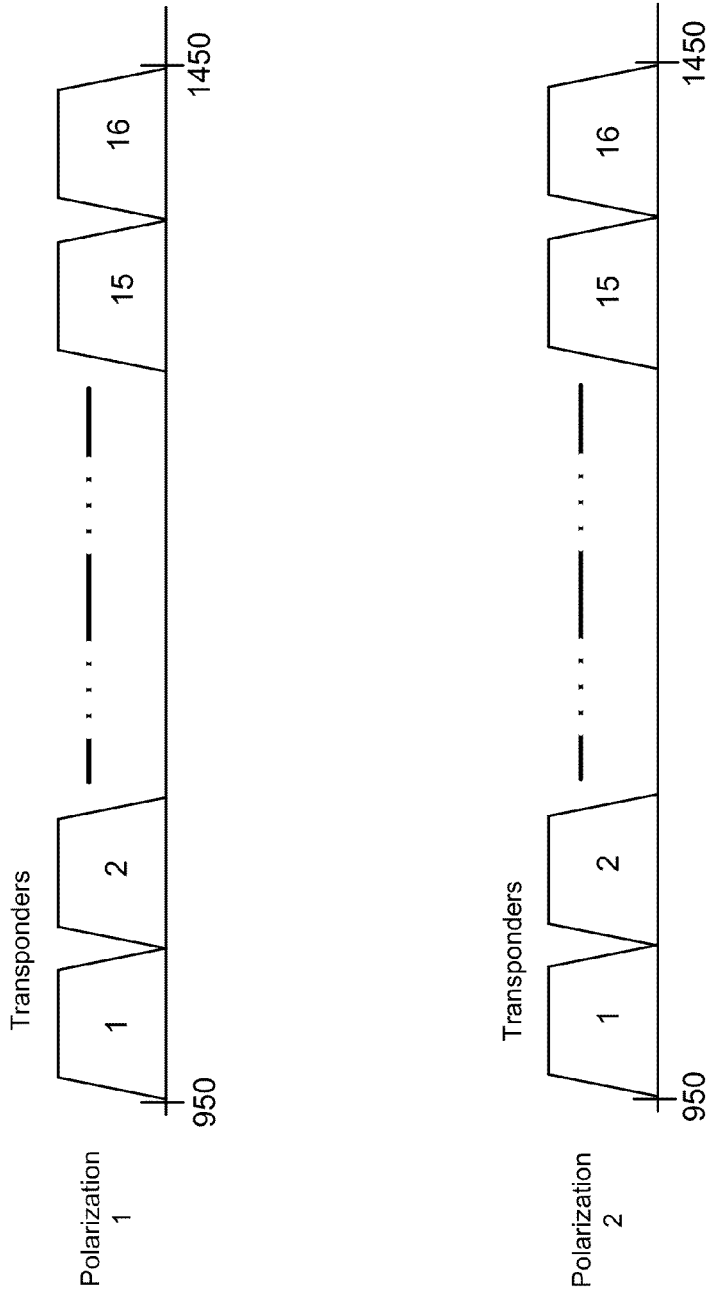
Figure 3:
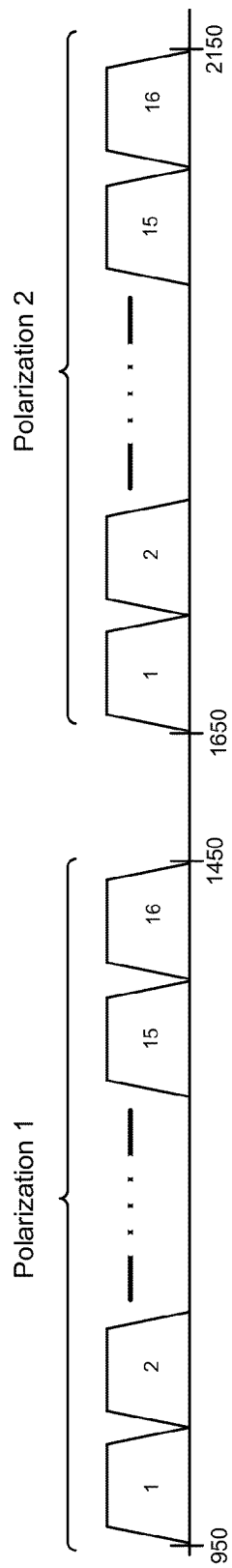
Figure 4:
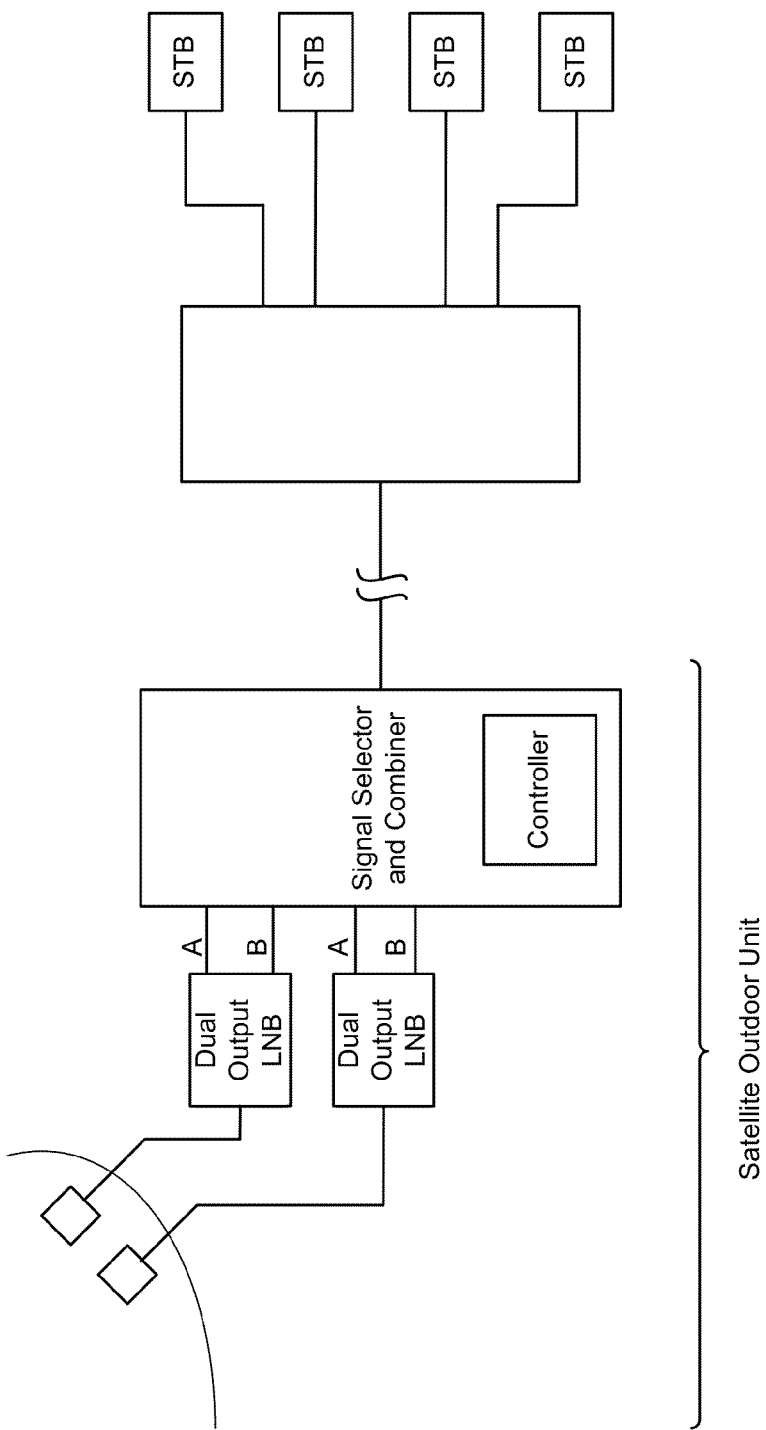
Figure 5:
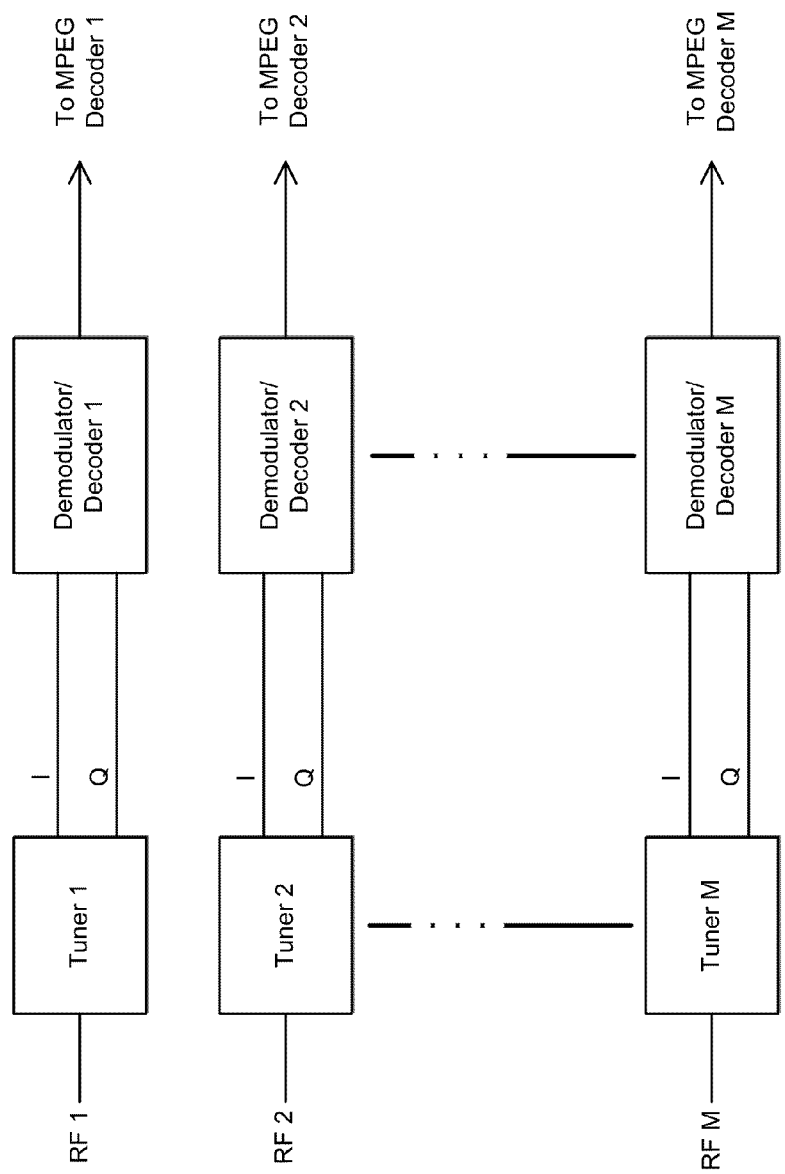
Figure 6:
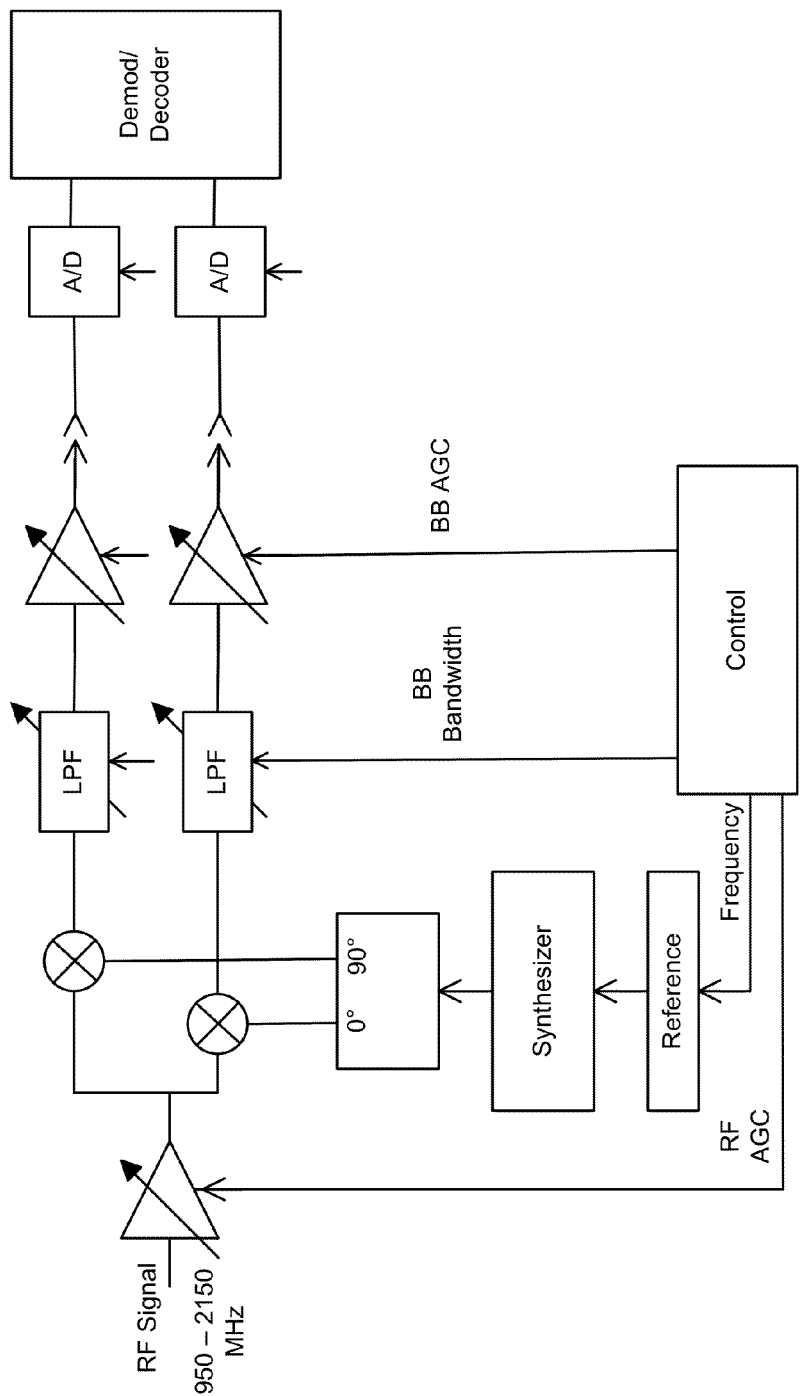
FIG. 6 shows a prior art tuner architecture.
Figure 7:
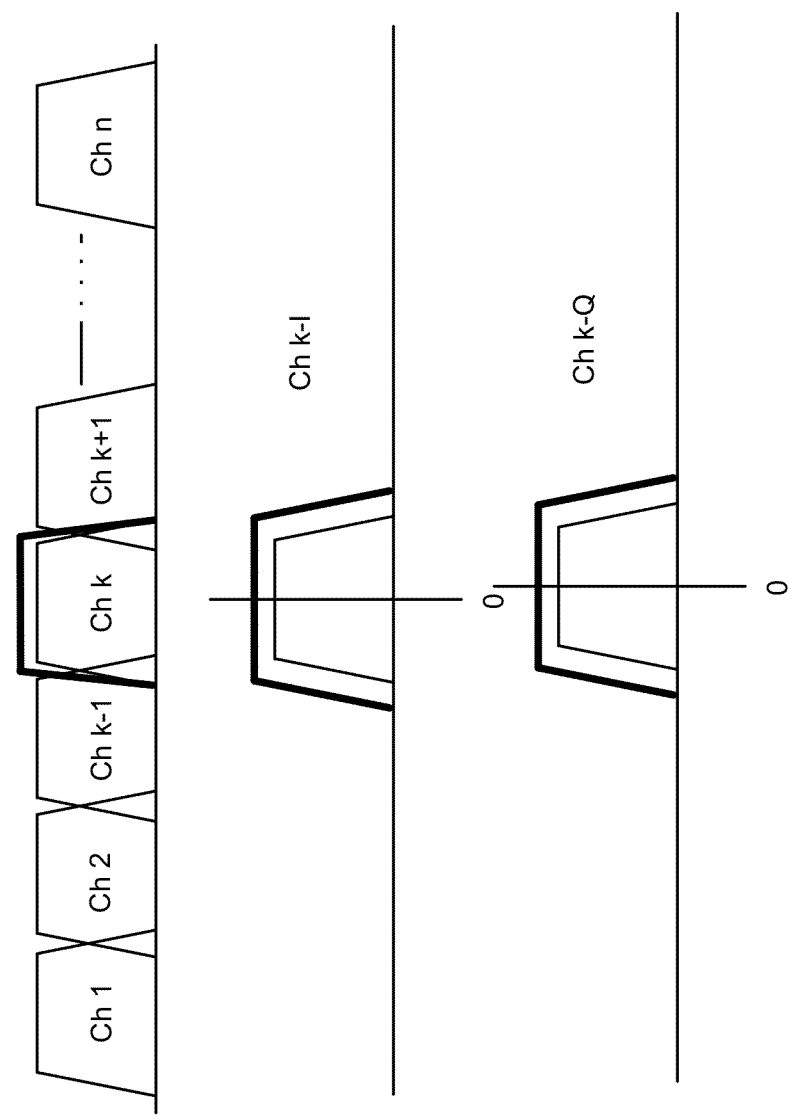
FIG. 7 shows the spectrum of the signals of prior art transponder channel tuning and selection.
Figure 8:
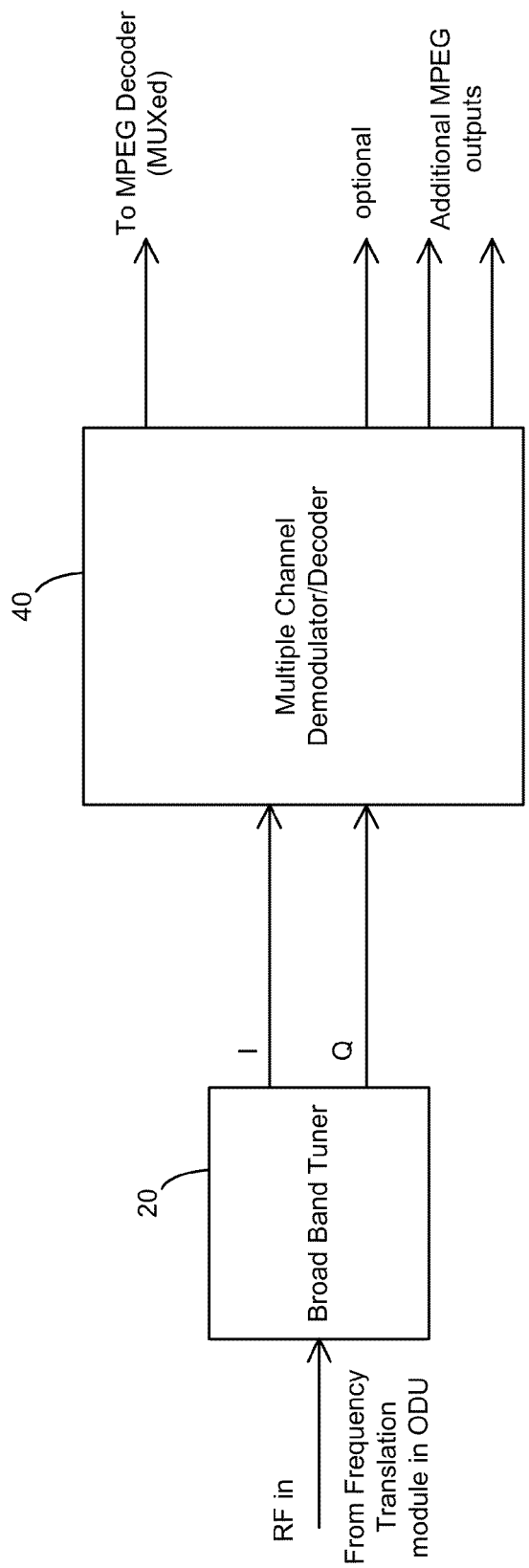
FIG. 8 shows a block diagram of a prior art iterative error correction decoder.

As shown in FIG. 9, instead of using multiple tuners to tune to the multiple transponder channel signals, as is the case in the prior art shown in FIG. 5, only one broadband tuner 20 is required in one embodiment of the disclosed configuration to tune to the multiple channels selected by the FTM and which are provided to the indoor unit over the IFL cable. However, in an alternative embodiment, multiple tuners can be used to translate sections of bandwidth for demodulation by multiple broadband demodulators. In one embodiment the number of tuners is between one and the number of transponder channels. The configuration depends on the final details of a particular system. The disclosed method and apparatus shows a single broadband tuner, but any other combination of tuners is possible. The digital output of the broadband tuner (or tuners) is processed by a multiple channel demodulator and decoder 40 to produce one or more MPEG streams. The streams comprise multiple video programs derived from the selected transponder channels. The multiple channel decoder includes an iterative error correction decoder that operates on all the selected channels.

Figure 10:
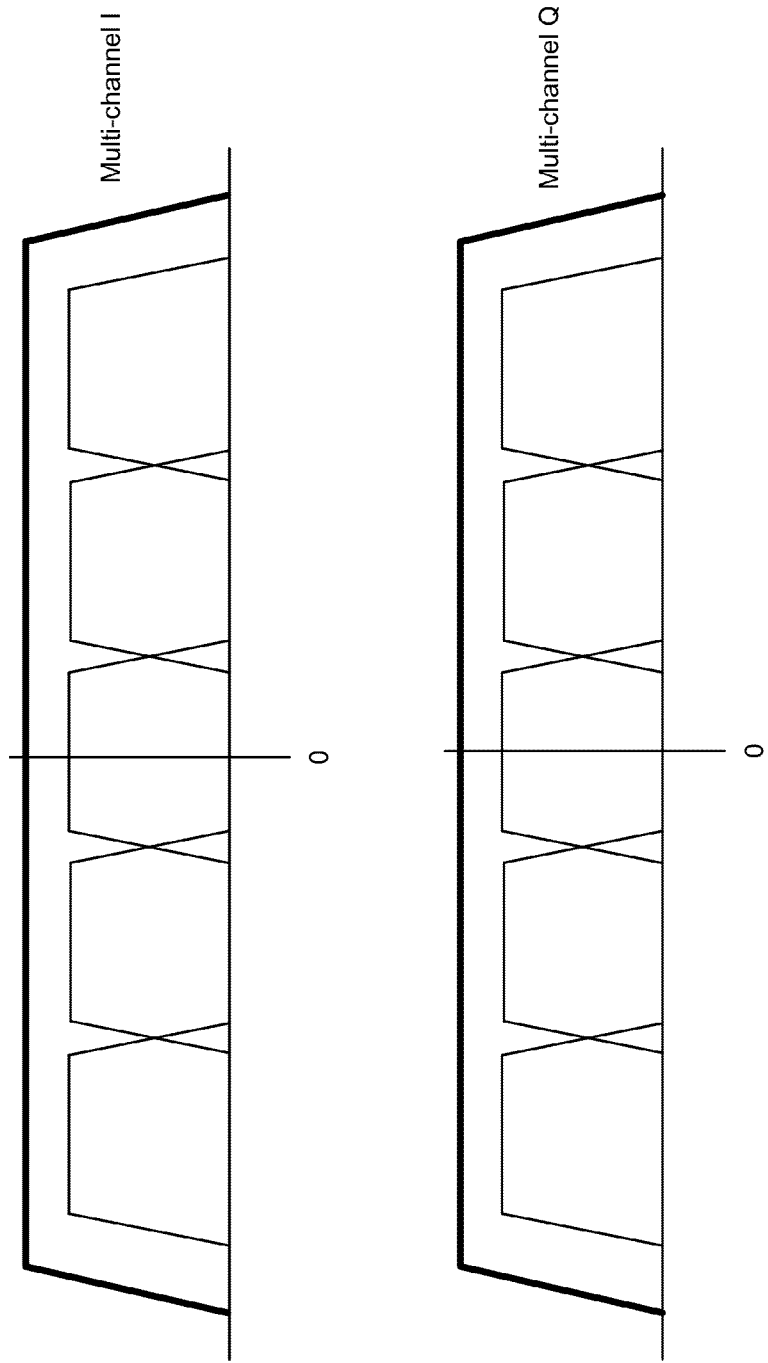
FIG. 10 shows a broadband tuner for use with the disclosed method and apparatus.

FIG. 10 shows a block diagram of a broadband tuner. Its general structure and architecture is similar to that of narrowband tuners; however, there are certain differences. For example, it is likely that all the desired channels are contiguous and their frequency assignments will not change (since the FTM will typically maintain the particular frequency assignments for the selected channels when a new channel is selected). Therefore, instead of a synthesizer, a fixed local oscillator can be used. This reduces the cost and complexity of the tuner. Also, the baseband filters are wider. The wider filters accommodate a frequency spectrum that includes multiple transponder channel signals. In contrast, a single transponder channel is selected in systems that use a narrowband tuner. Furthermore, in one embodiment, the A/D converters used with a broadband tuner operate at a higher speed than the A/D converters used with a narrowband tuner. This is necessary to sample the broadband I and Q outputs from the tuner down conversion process.

Figure 11:
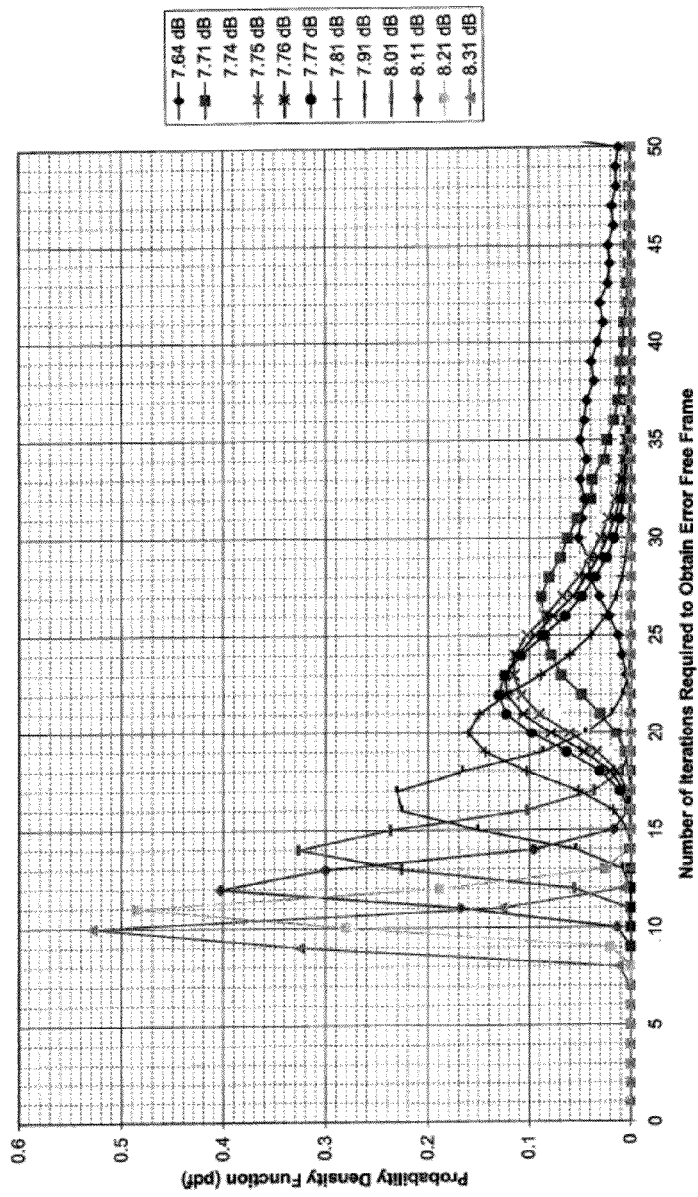
FIG. 11 shows channel tuning and selection of the broadband tuner.

FIG. 11 shows the spectral content of the signals received by the broadband tuner. As can be seen in the figure, the tuner processes and passes multiple transponder channels to the A/Ds to be aggregately processed by the broadband demodulator.

Multiple Iterative Decoding

Iterative decoders are Forward Error Correction (FEC) decoders that utilize iterative decoding techniques to achieve communications capabilities that approach the Shannon theoretical channel capacity. In one embodiment, various coding schemes are used to generate coded channels, including turbo codes, Low Density Parity Check (LDPC) codes, and others. The iterative processing is done by the decoder performing multiple iterations on a stream of received information in the coded channels. The result of each iteration is used to improve the result of the next iteration. The iterative process terminates when either the decoder determines that the received information has been properly decoded or when another stopping criterion has been met. In one case, the stopping criteria may include a determination that additional iterations will not significantly improve the decoding results. Alternatively, another stopping criterion can be used. For example, one such stopping criteria that can be used halts the process when a pre-determined maximum number of iterations have been performed. The maximum number of iterations performed is usually determined as a trade-off between performance requirements, processing delay and implementation complexity. Additional decoding iterations can improve performance (for example, reduce the bit error rate (BER)). However, performing additional iterations requires more complex processing and results in a larger delay. Often times, increasing the maximum number of iterations results in a very marginal improvement in decoding performance. Such marginal improvement does not warrant the increased implementation complexity.

Many techniques are known for determining when to stop an LDPC decoding process. For example, one technique verifies the consistency of parity bits with respect to information code bits. In another example, hard decisions are formed on every bit in a codeword. The hard decisions are formed from soft decisions that are output at every iteration for every bit in the codeword. If the rendered hard decisions result in a valid codeword, then the process can be stopped.

The complexity, power consumption, and die size of an iterative decoder's integrated circuits (ICs) are highly dependent on the numbers of iterations required to decode a codeword. A single channel decoder requires a processing engine that is capable of providing as many iterations as are necessary to achieve the desired performance (i.e., to attain a result from the last iteration that satisfies the desired criteria).

Figure 12:
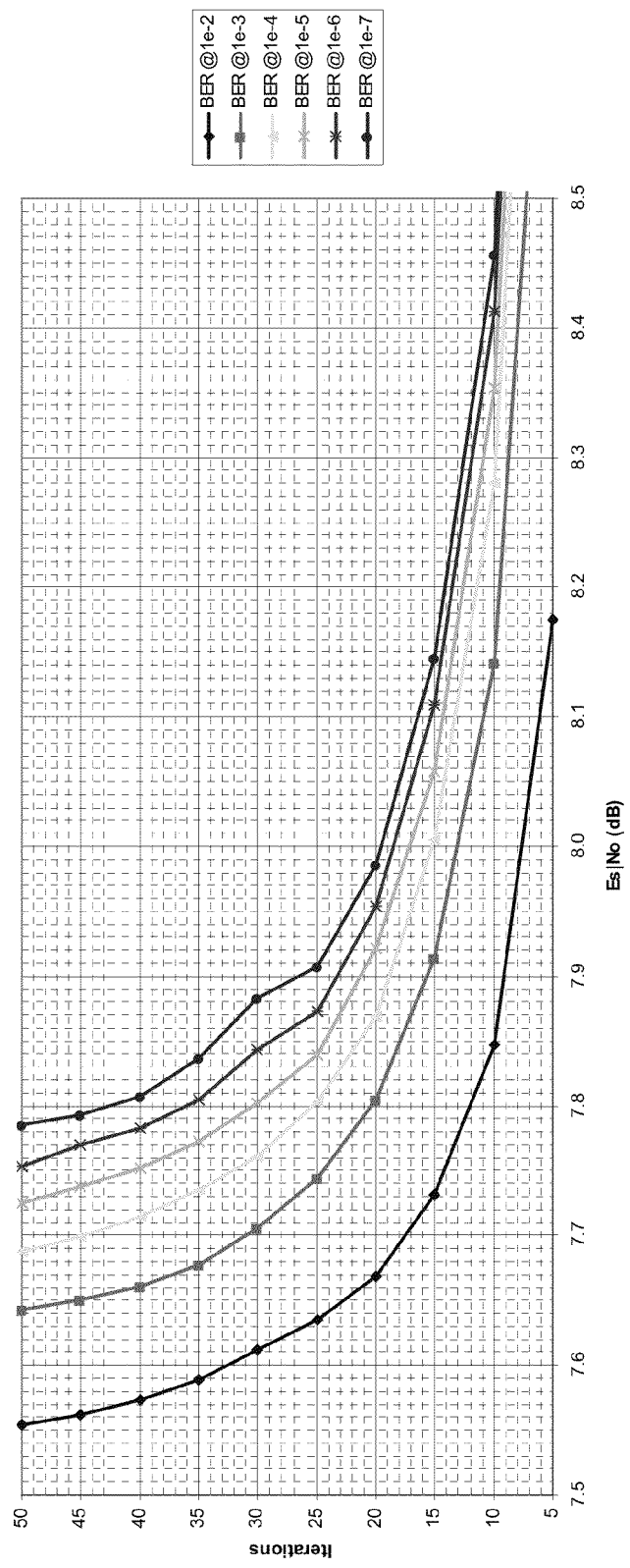
FIG. 12 shows probability densities of iterations required to deliver error-free decoding outputs evaluated at various signal to noise ratios, for a DVB-S2 (LDPC) decoder.

FIG. 12 illustrates the statistical nature of the iterative processing demonstrated by iterative decoders. The figure shows the number of iterations required to achieve error-free decoded output codeword (frames) for a concatenated encoded system. The concatenated encoded system of this example consists of a Bose-Chaudhuri-Hocquenghem (BCH) outer code and an LDPC inner code. This system is similar to the rate 3/4, 8-PSK (Phase Shift Keying) long code used by the Digital Video Broadcasting for Satellite (DVB-S2) standard.

These results demonstrate that the number of iterations is random. Accordingly, the number of iterations required to properly decode any given codeword can be significantly less than the maximum number of iterations a decoder must be able to perform to guarantee high accuracy decoding for all code words. Moreover, the results also indicate that the average number of iterations that a decoder would use is significantly smaller than maximum number that must be retained for worst-case code words. A processing engine that is required to be able to perform the maximum number of iterations is far more complex than one that is required only to perform the average number of iterations. A more complex decoder is undesirable because it will typically have higher power consumption, a higher clocking speed, and/or an increased circuit size.

Decoding several independent channels using a single engine allows the decoder to share its processing power among the decoder operations being performed for all of the channels to be decoded. As the number of channels increases, the total number of iterations required for decoding all the channels approaches the average number of iterations times the number of decoded channels. Combining the error correction processing of many independent channels into a single, high capacity decoder thus reduces the amount of variation in the total processing. Therefore the maximum number of total iterations that the decoder is designed to decode for all of the channels can be less.

Another important factor that further enhances decoding efficiency of shared decoding of multiple channels is the fact that the signal to noise ratio (SNR) of the various independent channels may be quite different. The reason the SNR is different is it is very difficult to accurately maintain a given power level for each of the multiple transponders transmitting from within a satellite as well as differences in the noise figure (NF). In addition, it is difficult to maintain a constant gain for each of the receiver's LNBs across all service frequencies. The differences within one polarization within the same satellite can be small (within 1-2 dB), but once an FTM switch is introduced, the difference between the reconstituted channels can be several dB. This is because with an FTM switch, transponder channels may be selected from different polarizations and on different satellites.

Figure 13:
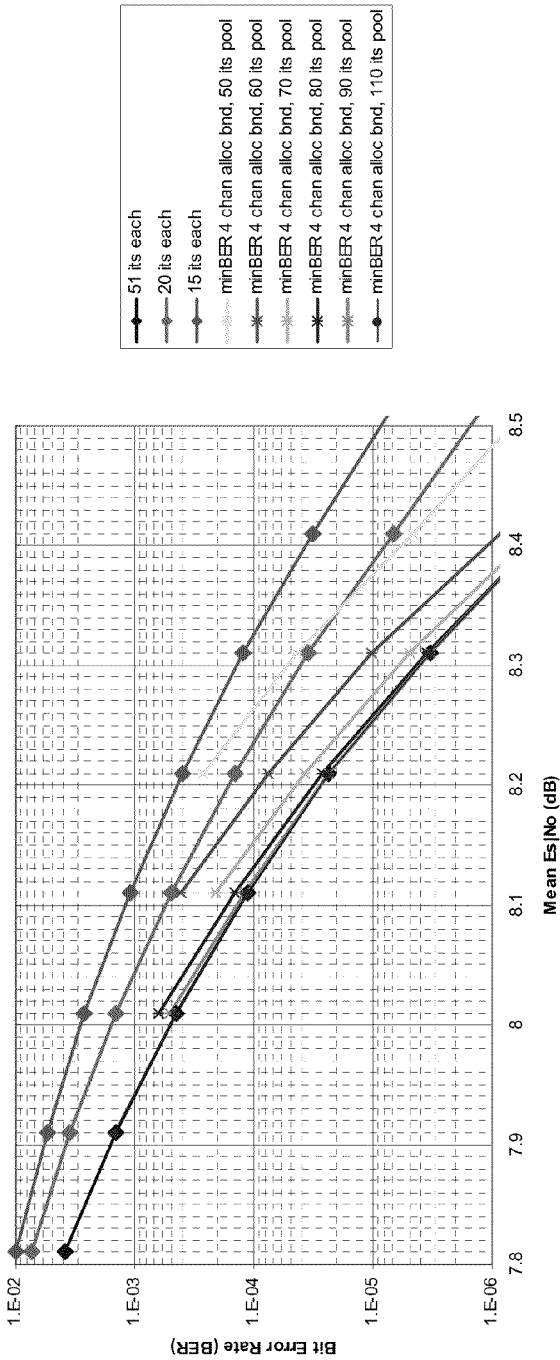
FIG. 13 shows maximum number of decoding iterations necessary to achieve certain average bit error rates, versus signal to noise ratio, for an LDPC decoder.

FIG. 13 shows the results of a simulation of a DVB-S2 iterative decoder used to decode one channel, where the maximum number of decoding iterations is plotted as a function of the symbol energy to noise ratio ($E_s/N_0$). The number of iterations is evaluated at several different target output bit error rates (BER). This simulation demonstrates that a decoder that is capable of providing a maximum of 45 iterations requires $E_s/N_0$ of 7.7 dB to achieve an average BER of 1e-4. However, the same BER performance requires only a maximum of 15 iterations at $E_s/N_0$ of 8.0 dB. Hence, for a 0.3 dB increase of $E_s/N_0$, a decoder can achieve the same performance with about 66% fewer iterations. This provides an advantage when a single decoder is being used, since being able to provide the additional iterations is essentially the same as increasing the performance of the channel by 0.3 dB. The additional 0.3 dB in performance improvement can be very important for proper system operation in some systems. However, in a multiple decoder system, where the different decoded channels are likely to operate at different SNRs, even with very minor SNR differences of as little as 0.1-0.5 db, the different channels are likely to require a significantly different number of iterations. Hence, a decoder whose processing can be shared among the various decoded channels can significantly reduce the total number of iterations required to achieve a certain performance as compared to a decoder in which the processing among decoders cannot be shared (i.e., in which there is a decoder dedicated to each channel).

Figure 14:
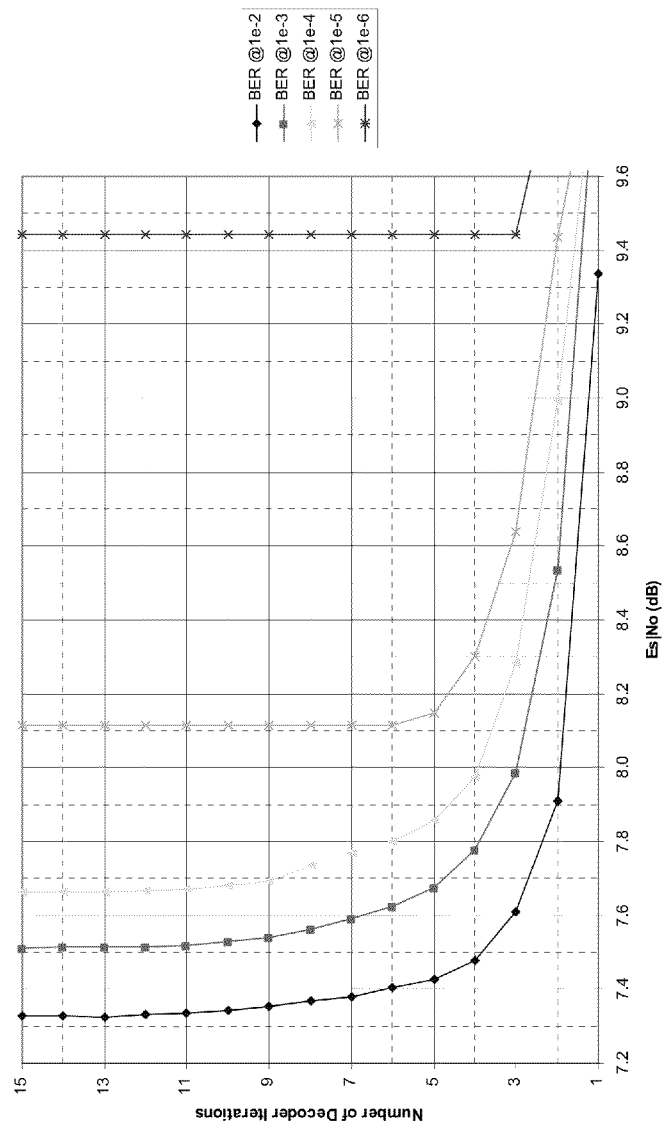
FIG. 14 shows bit error rate versus average signal to noise ratio, when the signal to noise ratio is normally distributed with 0.2 dB variance, parameterized by various decoding strategies including fixed iteration decoders and multiplexed decoder with various iteration pool capacity according to the disclosed method and apparatus.

FIG. 14 demonstrates further advantages of sharing iteration processing in a multiple decoder system and with channels of different Signal to Noise Ratios (SNRs). In this figure the BER performance vs. the mean $E_s/N_0$ of a simultaneous decoding of 4 channels of 8 PSK, DVB-S2 LDPC rate 3/4 decoders for the long (64800 bit) codeword. In this example, every decoded codeword is randomly sampled (before decoding) from a normally distributed $Es/N_0$ source, with a mean $E_s/N_0$ as indicated in the x-axis and an $E_s/N_0$ standard deviation of 0.2 dB. As can be seen from the figure, with as few as 80 total iterations per codeword period for all 4 channels, the BER performance is practically identical to that of a single decoder with 51 iterations for each channel, resulting in a total of 204 iterations. This ratio of 80/204 represents savings of nearly 60% in the total number of iterations required to decode 4 channels with a common decoder compared to 4 separate decoders.

Figure 15:
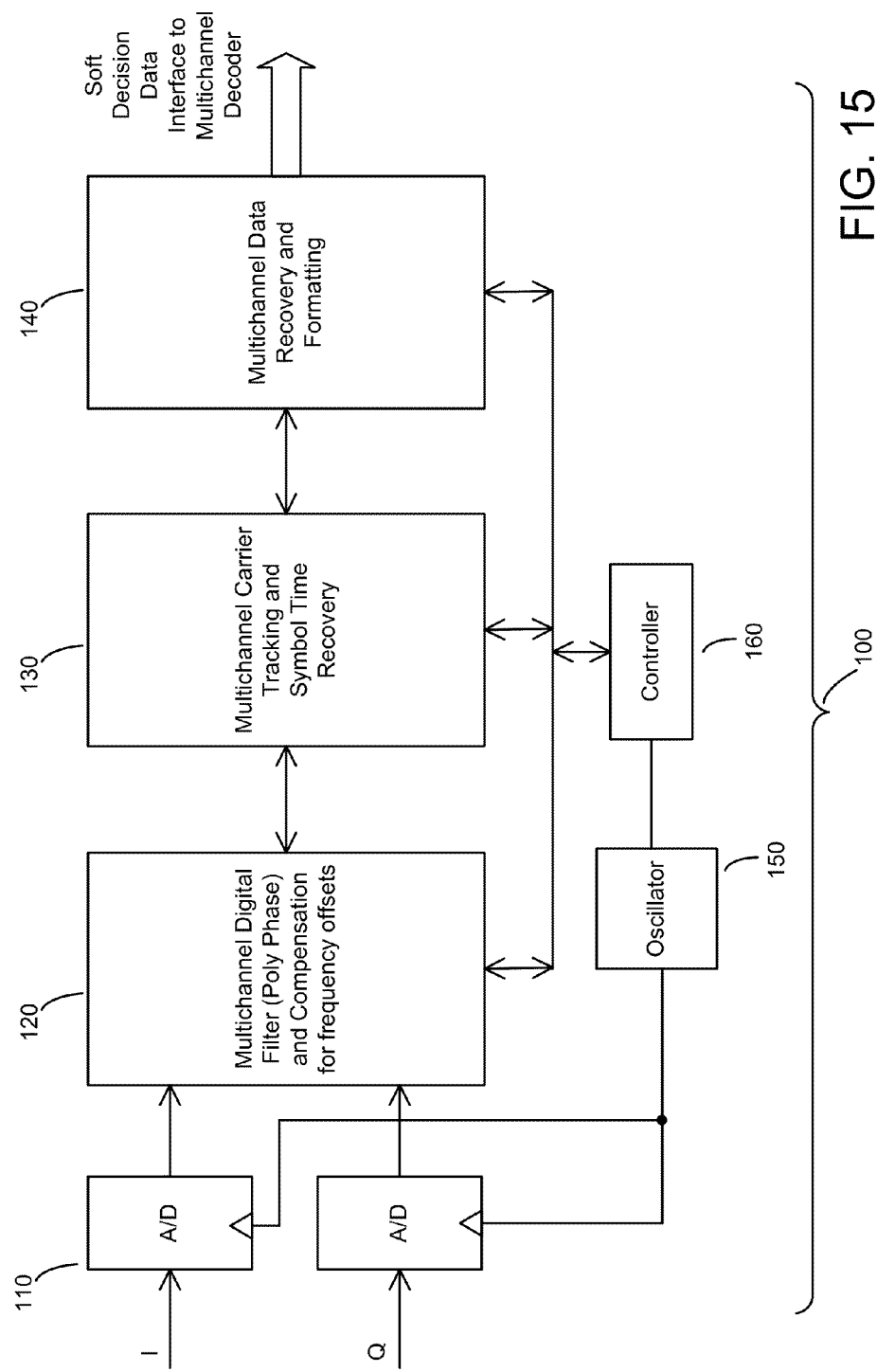
FIG. 15 shows maximum number of decoding iterations necessary to achieve certain average bit error rates, versus signal to noise ratio, for a Turbo Trellis Coded Modulation (TCM) decoder.

FIG. 15 shows similar results to those shown by FIG. 13 for a Turbo Trellis Coded Modulation (T-TCM) decoder. A Turbo TCM code is a different type of code that is usually iteratively decoded. The figure demonstrates that the same behavior will occur with any iterative decoding scheme. It can therefore be seen that the disclosed method and apparatus is very general and is applicable to all iterative decoders.

Broadband Demodulator Architecture

Figure 16:
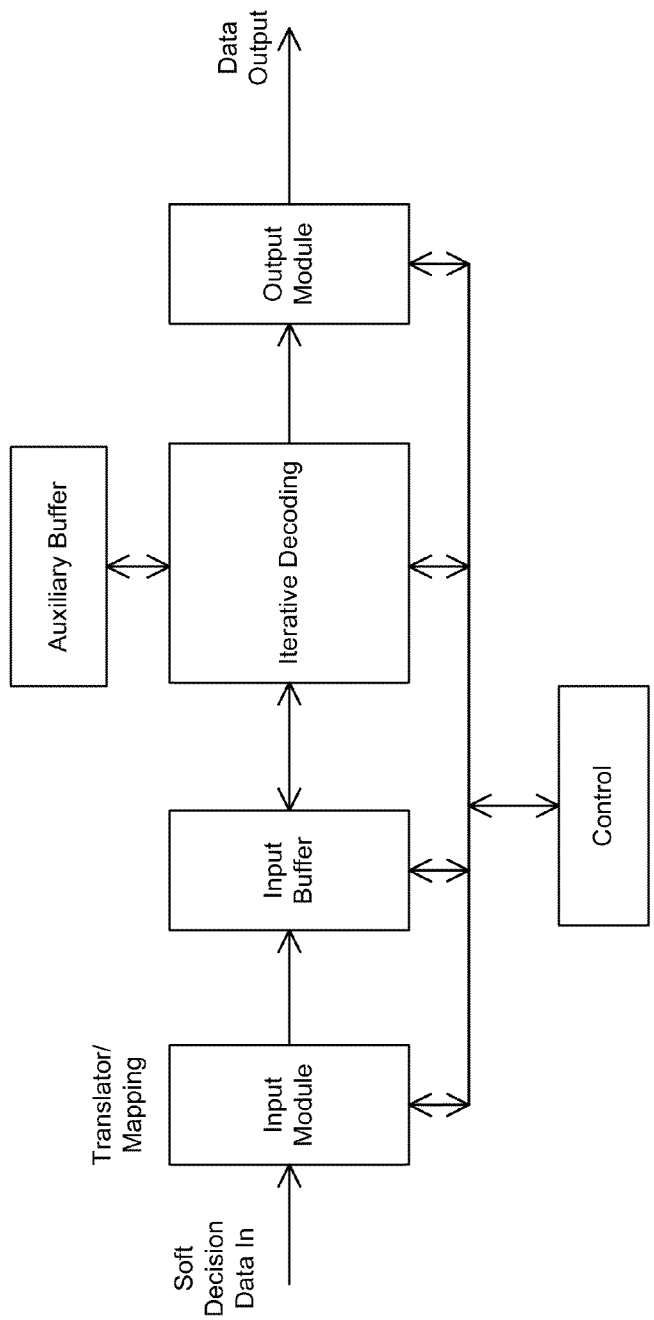
FIG. 16 shows a block diagram of a broadband demodulator with aggregate multi-channel demodulation/decoding capability according to the disclosed method and apparatus.
Figure 17:
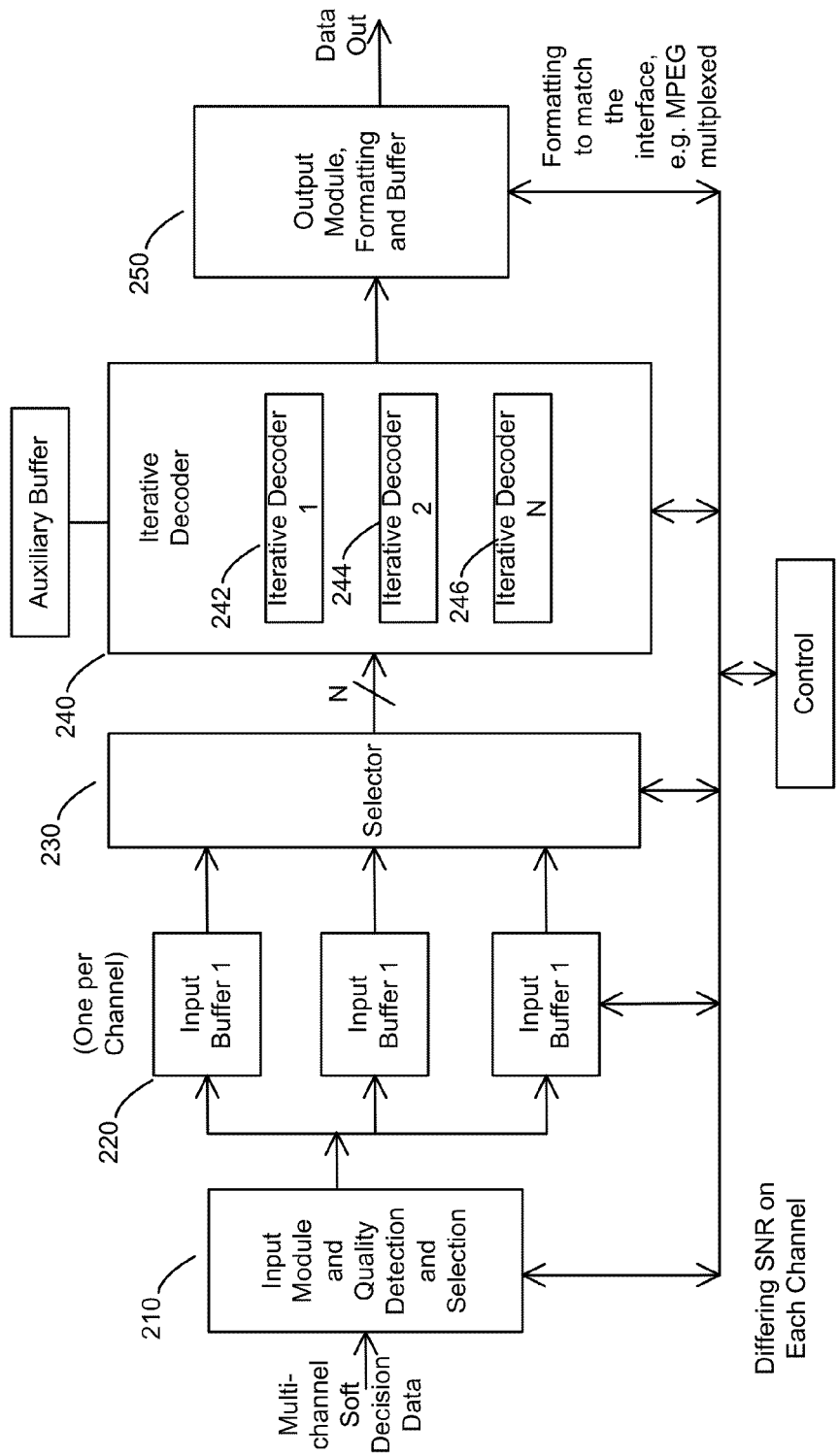
FIG. 17 shows a block diagram of multi-channel, multiple iteration decoders with pooled resources according to the disclosed method and apparatus.

FIGS. 15 through 17 illustrate the contents of the Demodulator/Decoder for decoding multiple channels shown in FIG. 9.

FIG. 16 shows a block diagram of one implementation of a Broadband Demodulator portion. FIG. 16 includes high speed I and Q analog to digital converters (A/Ds) 110 that digitize the baseband I and Q components. These I and Q components contain several transponder channels to be processed by the demodulator. Following the digitization, the samples are processed by a multi-channel digital filter unit 120 (such as a multi-channel poly-phase filter). The processing includes all the necessary frequency rotation and frequency down-conversion. The FTM in the ODU selects transponder channels from one or more satellites. When the FTM selects transponders from more than one satellite, it is likely that the channels from these different satellites will have different frequency offsets due at least to individual LNB offsets. Hence, in one embodiment, the multi-channel filter unit 120 performs a frequency offset correction that aids the frequency acquisition process when switching channels.

The multi-channel carrier tracking and symbol time recovery circuitry 130 performs the traditional carrier tracking and symbol timing extraction associated with quadrature amplitude modulation (QAM)/PSK coherent demodulators. Following the carrier and symbol timing recovery and tracking process, the demodulator 140 processes the constellation samples and outputs a soft decision bit stream required for FEC decoding. The number of soft decision bits in each sample delivered by the demodulator 140 typically ranges from 4 to 6. A/D quantization can range from 6-9 bits and depends on the modulation type. Lesser numbers of soft decision bits can be used in applications where greater levels of quantization degradation are acceptable. The broadband demodulator circuit 100 also contains an oscillator 150 to drive the A/D sample clock and any internal clocking needed in other components. The circuit 100 further includes a controller 160 to set processing parameters of the blocks.

The demodulation steps described above include well-known techniques that are discussed extensively in the literature including in the books such as "Signal Processing in Telecommunications" by Biglieri and Luise, "The Theory and Practice of Modem Design" by Bingham and "Multirate Signal Processing for Communication Systems" by Harris.

Method for Multi Iterative Decoder Processing

Iterative decoding of LDPC codes and turbo codes provides enhanced decoding performance, which is attractive in many wireless applications including Direct Broadcast satellite (DBS). Techniques for decoding such codes are well known and can be found in contemporary communications and coding books and scientific literature.

FIG. 17 shows the block diagram of a multi-channel iterative decoder according to the disclosed method and apparatus. The decoder is constructed to process multiple channels through a common decoding resource (e.g., iterative decoder 240). The decoder 240 takes advantage of the statistical nature of the decoding process and the potential difference in the signal to noise ratios of the channels in order to enhance decoding efficiency. Viewed from the input to the output, all channels are processed simultaneously. However, latency is introduced through the process, since the processing of each channel is done sequentially within the iterative decoder 240.

Multiple channels are processed by an input module 210. Each channel is transmitted by a transmitter (e.g., satellite transponder) that encodes data into data blocks having a predetermined block size. The received data is stored with identified block boundaries. Decoding is done on integral blocks of coded data. Block sizes can range from small to large depending on the application, which can be from hundreds to tens of thousands of soft decisions per block. As an example, a DVB-S2 broadcast encoder generates 64,800 code bits per codeword (block), and each coded bit requires a (log-likelihood) soft decision of 6-bit width at the decoder.

Soft decision bits (i.e., a stream of "soft decision data") from each channel are processed and a channel quality measure is determined within the input module 210 for each stream. In one embodiment, the quality measure is a signal to noise ratio (SNR). Alternatively, the quality measure is a signal to noise and distortion ratio (SINAD) or signal to interference plus noise ratio (SINR). In yet another embodiment, the quality measure is determined based on the error rate of an uncoded known code word, such as a synchronization word.

The soft decision data is buffered in separate input buffers 220. One such input buffer 220 is associated with each channel. The soft decision data is stored with the associated quality measure for that particular channel. In one embodiment, more than one buffer 220 is provided for each channel to be decoded. It should be noted that only one such input buffer 220 is shown to be associated with each channel in FIG. 17. The input buffers 220 are logically separated for each input channel. However, the input buffers 220 can be implemented in one memory block with pointers used to identify the portion of the memory that makes up each such input buffer 220. Those skilled in the art will understand that there are many ways to implement such input buffers. Any such implementation would be within the scope of the disclosed method and apparatus.

The iterative decoder 240 processes the multiple channels by selecting blocks of data from one of the input buffers 220. The blocks associated with the channels are selected one at a time using a selector unit 230. Each block of channel data is processed by the iterative decoder unit 240. The decoded information is then forwarded to an output module 250. Depending on the transmission scheme, the output module may have to re-insert MPEG sync bytes that are required by an MPEG decoder. These sync bytes may be missing because they have been suppressed by the satellite operator to conserve bandwidth.

In the present description, it is assumed that the iterative decoder 240 processes one channel at a time. However, in one embodiment, multiple decoders 242, 244, 246 are provided within the decoder 240. Each channel is associated with one decoder 242, 244, 246. In this case, each such decoder 242, 244, 246 processes one channel in parallel with the other decoders 242, 244, 246. In one such embodiment, the number of decoders 242, 244, 246 will be less than the total number of channels. Accordingly, there will be some sharing of the decoding resources. Accordingly, depending on the specific decoder implementation, multiple channels can be processed at one time.

Once a decoder 242, 244, 246 finishes processing the blocks received in one channel, the decoder 240 selects a second channel for processing. The decoders 242, 244, 246 continue in this manner until all of received blocks for all of the channels of interest have been decoded. Multiple decoders within the iterative decoder 240 allow parallel processing of different channels while still taking advantage of the combining. The individual decoders 242, 244, 246 can be used on an as available basis by the next input channel scheduled for processing. Note that the description above can be modified to allow various options for the number of buffers and how many buffers are available per channel, the number of iterative decoders used, the synchronization between the various channels (they can be time synchronized or not, have common boundaries or not, have identical block size or not, etc), without loss of generality. The basic concept of sharing one or more decoding engines in an iterative decoding system shared among multiple channels requires small implementation modifications to be adapted to each of the above scenarios.

Data processed by the FEC is generally parsed in terms of code words. Sequences of known sync symbols ('Unique Words') are periodically inserted into the symbol stream every one or more code words to enable a demodulator to synchronize to the symbol stream. These Unique Words also provide reference to inner code codeword boundaries for an iterative decoder, such as an LDPC decoder or a turbo-TCM decoder.

Multiplexed Decoder Processing Rule

FIGS. 18 to 21 show flowchart descriptions of the rules for selecting data from the input buffers, determining the manner and number of iterations, and terminating channel decoding for a multi-channel LDPC decoder shown in FIG. 17. Tables 1-3 show example parameter values used in the flowcharts.

Figure 18:
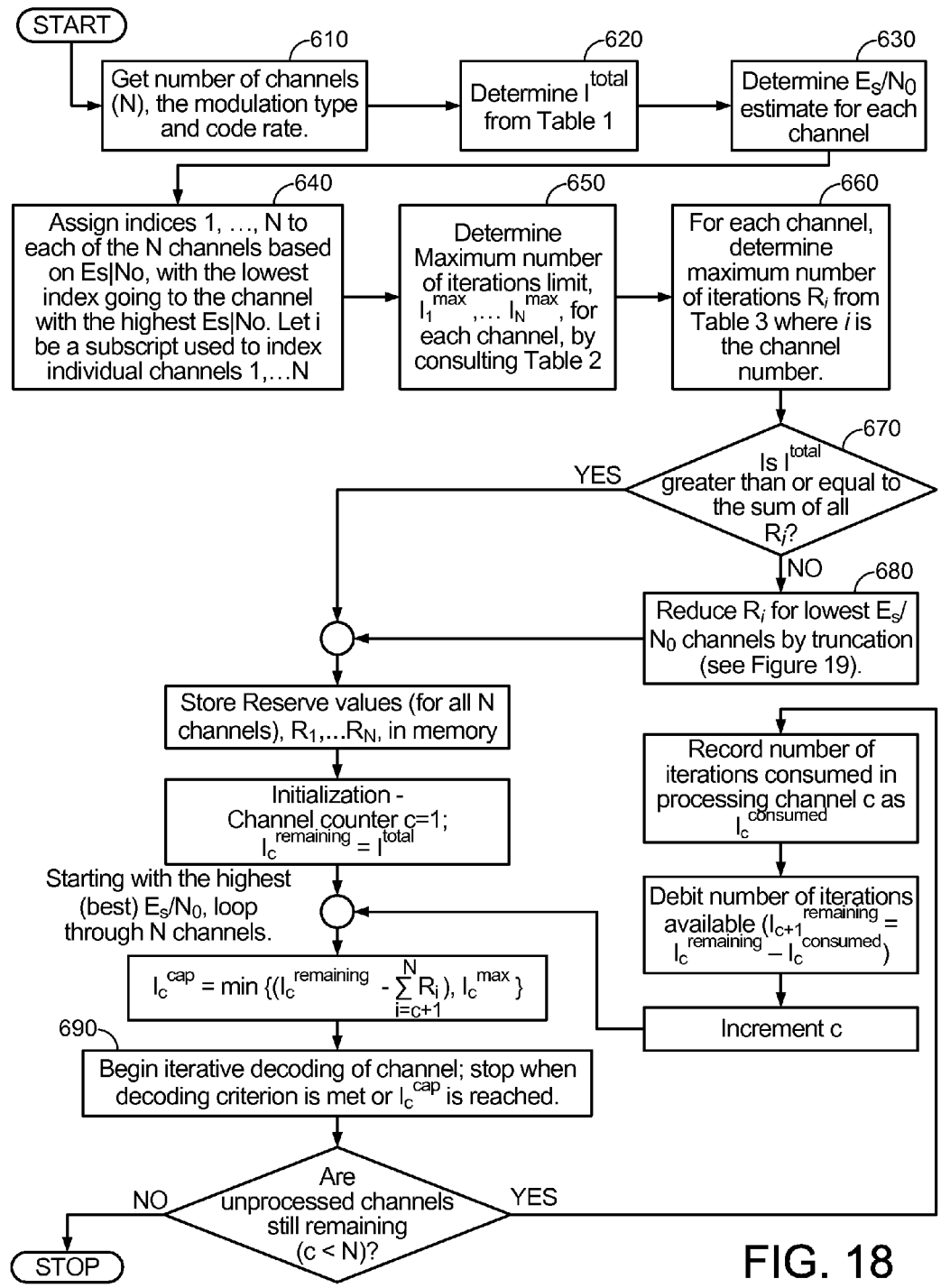
FIGS. 18-21, show flow charts describing iteration allocation in multi-channel, multiple iteration decoders.

FIG. 18 shows the process implemented in one embodiment of the disclosed method and apparatus. The first step 610 reads the number of channels, the modulation type, and the code rate. The system is then initially calibrated by reading from Table 1 the total number of iterations, $I^{total}$ that the decoding hardware can execute in processing the N channels (step 620). Since the various channels can operate with different modulation and code rates, the same hardware may be able to perform a different number of total iterations (for example, per codeword) for different modulation and code rate configurations. We assume, without loss of generality, that all of the channels have the same modulation and coding and that the code words among the various channels are fully synchronized in time. These two assumptions are not essential but are used here for simplicity. If the channels have different modulation/coding, the total number can be computed either by a larger table, by adding the individual iterations capable of being performed by each channel to find the total, or by similar techniques. Also, if the channel code words are not synchronized, the channels can either be synchronized by buffering the "early" channels or by performing the processing unsynchronized with small, straightforward modifications to the algorithms described.

Step 630 computes the quality measure for each channel. In one embodiment, $E_s/N_0$ (the symbol energy to noise spectral density ratio of each of the channels) is used as the quality measure. Computing the $E_s/N_0$ is well known by those skilled in the art. The input code words that are ready for decoding are ranked according to their $E_s/N_0$ (step 640). In one embodiment, the channel with the highest $E_s/N_0$ is indexed first and the channel with the lowest $E_s/N_0$ is indexed last. If a group of channels has identical $E_s/N_0$, they are indexed arbitrarily within the group. Accordingly, scheduling is done based on the value of the quality measure. Decoding is then done in accordance with the schedule.

When resources are inadequate to support operation of all of the channels, a simple (truncation) mechanism is used to make sure that the worst Es/No channels are not processed. One example of when resources are inadequate is when the expected average number of iterations for all channels collectively is greater than the processing resources available.

In an alternate embodiment, when BCH correction stopping is used, $E_s/N_0$ ordering does not necessarily make the decoding scheme any more effective, in terms of minimizing the aggregate BER, and ordering by $E_s/N_o$ may or may not be used.

The maximum number of iterations, $I^{max}$, computed for each channel, and reserve iterations $R_i$ for all the channels are determined in steps 650 and 660, respectively, by consulting Tables 2 and 3. The determination of $I^{max}$ and $R_i$ is based on the modulation, code rate and the $E_s/N_o$ for each channel. In one such embodiment of the disclosed method and apparatus, scheduling includes using the quality measure to estimate the maximum number of iterations for each stream. If the hardware can support all the reserve iterations of all the channels (determined in step 670), the process can proceed. Otherwise, if the hardware cannot support all the reserve iterations, the reserve iterations need to be truncated (step 680) according to the flowchart of FIG. 19 before the process proceeds.

The decoder step 690 starts decoding (iterating) each channel, one at a time. If a channel decodes 'cleanly', then the decoding of that channel stops, the number of iterations consumed is recorded, and decoding commences on the next channel. One means by which clean decoding can be determined, for example, is by checking whether an iterative decoding outcome leads to a valid inner code or a valid outer code. One example of a valid inner code is an LDPC code. One example of a valid outer code is a BCH codeword. Alternatively, any one of numerous other known and published 'early stopping' techniques can be used. The number of iterations that can be allocated to a given channel's processing is limited by two factors: a) the per-channel limit, $I^{max}$, and b) the difference between the total remaining available iterations (to be allocated among the given channel and the channels yet unprocessed) and the number of iterations that would ensure that all unprocessed channels, excluding the given channel, each receive its reserve number of iterations. This ensures that all channels are allocated at least a reserved number of iterations, but enables a channel currently being processed to borrow iterations beyond its reservation allocation from other channels, if surplus iterations are available. The initialization process guarantees that the total number of iterations available always exceeds the sum of iterations reserved for all channels.

Figure 19:
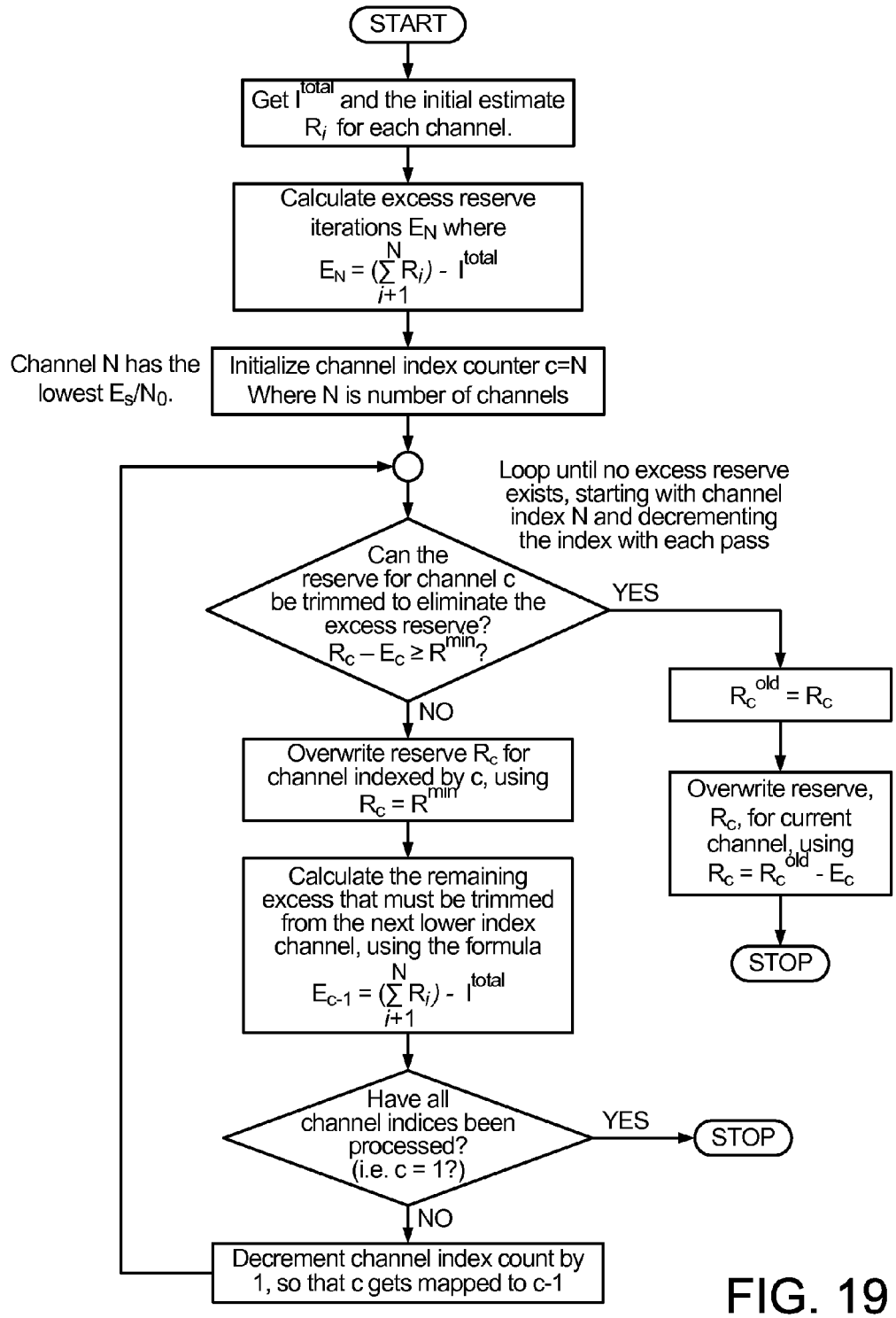

FIG. 19 shows a flow chart for a reserve iteration truncation process (which is used within the allocation algorithm detailed in FIG. 18), for cases where the $I^{total}$ is smaller that the sum of reserve iterations for all the channels. The process is straight forward: it removes iterations from the lowest priority channels until the number of reserve iterations required for all the channels is below the total available $I^{total}$. When truncating from the lowest priority up to the highest, there is a minimum number of iterations $R^{min}$ allocated to each channel. $R^{min}$ can be derived from a lookup table that is a function of transmitted modulation (e.g. 8-PSK or QPSK), code rate, and $E_s/N_0$ inputs. Alternatively, $R^{min}$ may be assigned a static number, such as the values 1 or 0, which may be preferred parameterizations.

Figure 20:
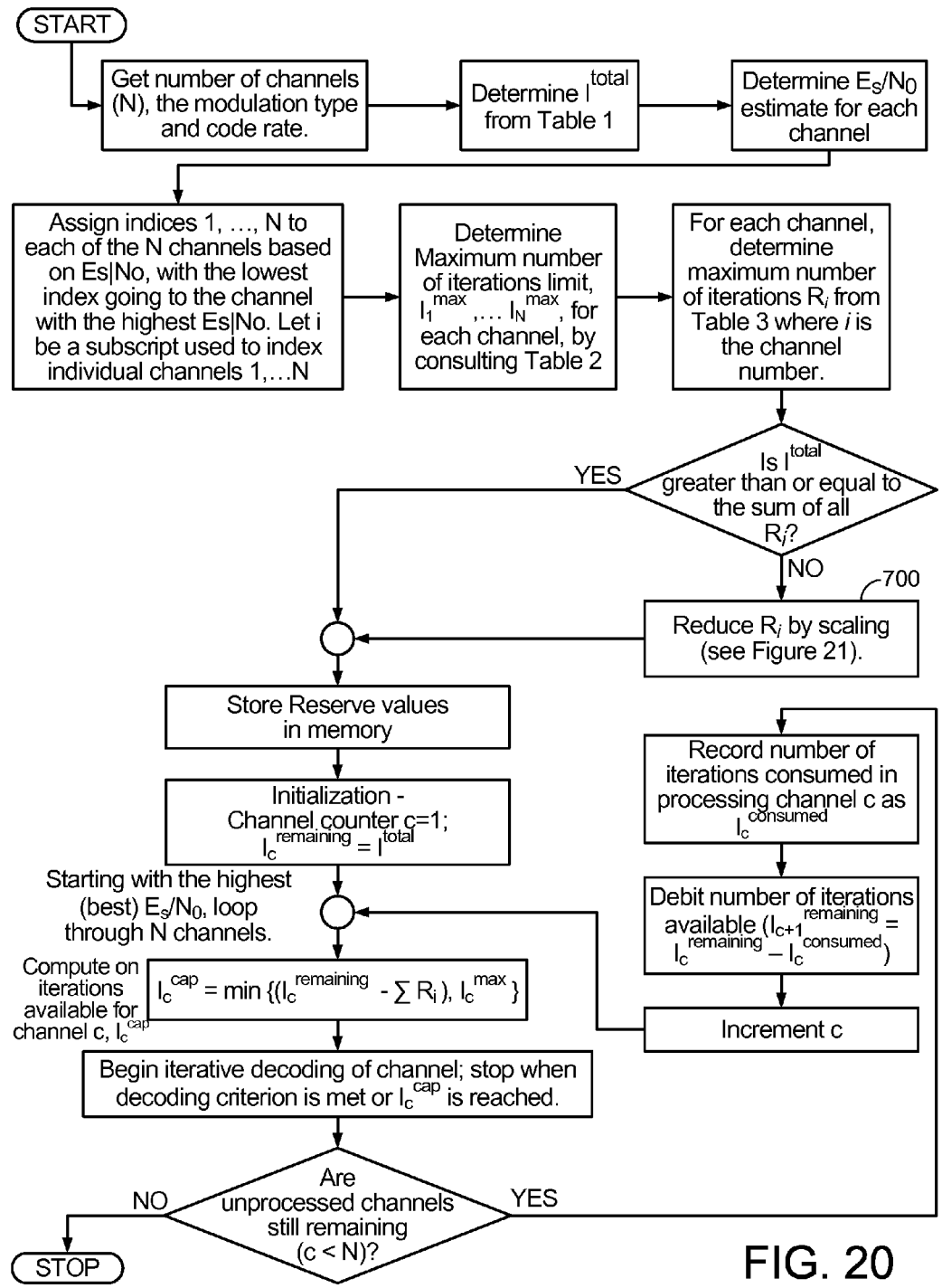
Figure 21:
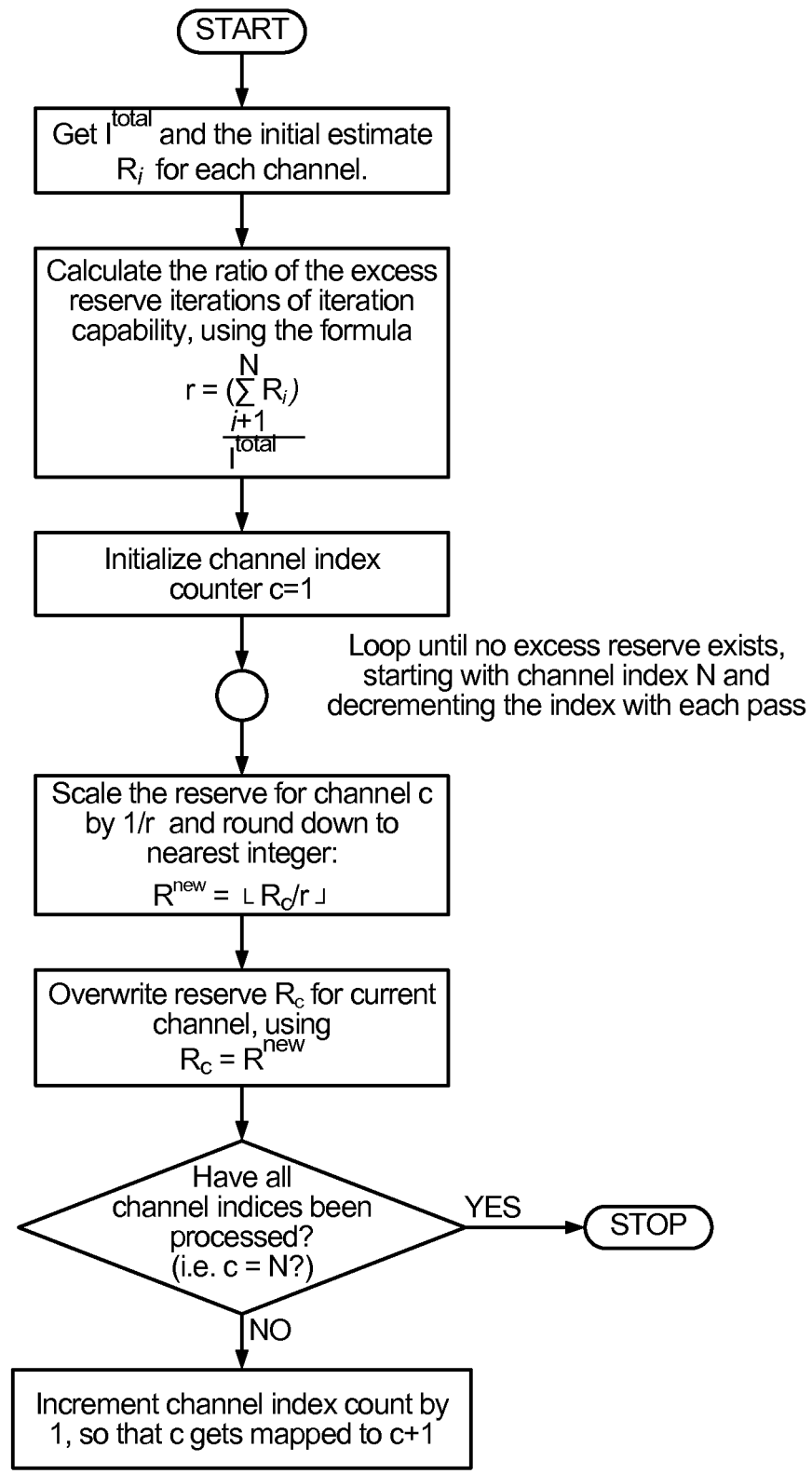

FIGS. 20 and 21 provide flowcharts for the case where the number of reserved iterations is reduced by a linear reduction of the reserve iterations of all the channels. This reduction is done in order to bring the total number of iterations below $I^{total}$. This method is used as an alternative to truncation of reserve iterations starting from the lowest priority channels and moving upward. FIG. 20 provides details on the overall iteration allocation method (analogous to the algorithm detailed by FIG. 18).

FIG. 21 provides details on the linear reduction sub-procedure 700 used within the algorithm described in FIG. 20.

TABLE 1

Illustrative Example of Hardware Iteration Capability, $I^{total}$, as a function of modulation type and code rate

| Modulation type and code rate | HW Iteration Capability, $I^{total}$ |
|---|---|
| QPSK, rate ½ | 167 |
| QPSK, rate ⅗ | 123 |
| QPSK, rate ⅔ | 164 |
| QPSK, rate ¾ | 149 |
| QPSK, rate ⅘ | 142 |
| QPSK, rate ⅚ | 138 |
| QPSK, rate 8/9 | 166 |
| QPSK, rate 9/10 | 165 |
| 8-PSK, rate ⅗ | 81 |
| 8-PSK, rate ⅔ | 109 |
| 8-PSK, rate ¾ | 100 |
| 8-PSK, rate ⅚ | 92 |
| 8-PSK, rate 8/9 | 110 |
| 8-PSK, rate 9/10 | 110 |

TABLE 2

Illustrative Example of the max allocation (per channel), $I_i^{max}$ as a function of modulation type, code rate, and Es|No (here only the table for 8-PSK rate ¾ is illustrated)
8-PSK Rate ¾

| Channel Es/No (dB) | Max allocation, $I_i^{max}$, for channel (indexed by i) |
|---|---|
| 6.81 | 1 |
| 6.91 | 1 |
| 7.01 | 1 |
| 7.11 | 2 |
| 7.21 | 2 |
| 7.31 | 3 |
| 7.41 | 50 |
| 7.51 | 50 |
| 7.61 | 50 |
| 7.64 | 50 |
| 7.71 | 50 |
| 7.74 | 50 |
| 7.75 | 50 |
| 7.76 | 50 |
| 7.77 | 50 |
| 7.81 | 50 |
| 7.91 | 26 |
| 8.01 | 21 |
| 8.11 | 18 |
| 8.21 | 16 |
| 8.22 | 16 |
| 8.31 | 13 |
| 8.41 | 12 |
| 8.51 | 11 |
| 8.61 | 10 |
| 8.71 | 9 |
| 8.81 | 8 |
| 8.91 | 8 |
| 9.01 | 7 |
| 9.11 | 7 |
| 9.21 | 6 |
| 9.31 | 6 |
| 9.41 | 6 |

TABLE 3

Illustrative Example of Reserve Iterations held (per single channel), $R_i$ as a function of modulation type, code rate, and Es|No (here only the table for 8-PSK rate ¾ is illustrated)
8-PSK Rate ¾

| Channel Es/No (dB) | Reserve iterations, $R_i$, for a single channel (indexed by i) |
|---|---|
| 6.81 | 1 |
| 6.91 | 1 |
| 7.01 | 1 |
| 7.11 | 2 |
| 7.21 | 2 |
| 7.31 | 3 |
| 7.41 | 50 |
| 7.51 | 50 |
| 7.61 | 42 |
| 7.64 | 38 |
| 7.71 | 28 |
| 7.74 | 26 |
| 7.75 | 25 |
| 7.76 | 24 |
| 7.77 | 23 |
| 7.81 | 21 |
| 7.91 | 17 |
| 8.01 | 14 |
| 8.11 | 12 |
| 8.21 | 11 |
| 8.22 | 11 |
| 8.31 | 10 |
| 8.41 | 9 |
| 8.51 | 8 |

TABLE 3-continued

Illustrative Example of Reserve Iterations held (per single channel), $R_i$ as a function of modulation type, code rate, and Es|No (here only the table for 8-PSK rate ¾ is illustrated)
8-PSK Rate ¾

| Channel Es/No (dB) | Reserve iterations, $R_i$, for a single channel (indexed by i) |
|---|---|
| 8.61 | 7 |
| 8.71 | 7 |
| 8.81 | 6 |
| 8.91 | 6 |
| 9.01 | 6 |
| 9.11 | 5 |
| 9.21 | 5 |
| 9.31 | 5 |
| 9.41 | 4 |

While various embodiments of the disclosed method and apparatus have been described above, it should be understood that they have been presented by way of example only, and should not limit the claimed invention. Likewise, the various diagrams may depict an example architectural or other configuration for the disclosed method and apparatus. This is done to aid in understanding the features and functionality that can be included in the disclosed method and apparatus. The claimed invention is not restricted to the illustrated example architectures or configurations, rather the desired features can be implemented using a variety of alternative architectures and configurations. Indeed, it will be apparent to one of skill in the art how alternative functional, logical or physical partitioning and configurations can be implemented to implement the desired features of the disclosed method and apparatus. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the disclosed method and apparatus is described above in terms of various embodiments and implementations, it should be understood that the various features, aspects and functionality described in one or more of the individual embodiments are not limited in their applicability to the particular embodiment with which they are described. Thus, the breadth and scope of the claimed invention should not be limited by any of the above-described embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

A group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the disclosed method and apparatus may be described or claimed in the singular, the plural is contemplated to be within the scope thereof unless limitation to the singular is explicitly stated.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A method of processing a plurality of coded channels with error correction coding, the method comprising:
   a) demodulating a plurality of channels to produce a stream of soft decision data for each channel;
   b) determining a quality measure for each stream;
   c) scheduling the decoding of each stream based on the quality measure; and
   d) decoding each stream in accordance with the schedule using a number of iterative decoders that is at least one less than the number of streams to produce decoded channel data streams.

2. The method of claim 1, wherein scheduling the decoding includes using the quality measure to estimate a maximum number of iterations for each stream.

3. The method of claim 1, further including:
   a) after demodulating the plurality of channels, storing each stream of soft decision data in at least one input buffer; and
   b) before decoding each stream, reading each stream from the at least one input buffer.

4. The method of claim 3, wherein each stream of data is read from the input buffer as sequential blocks of data and decoded by applying one block to each available iterative decoder.

5. The method of claim 1, further including, after decoding each stream, storing the decoded channel data stream in at least one output buffer.

6. The method of claim 1, further including:
   a) determining processing requirements based on the average number of iterations required to decode all of the streams; and b) providing an iterative decoder having processing capability that is no greater than the determined processing requirements.

7. The method of claim 1, wherein scheduling includes using the quality measure to determine the priority among streams.

8. The method of claim 7, wherein scheduling further includes determining whether some streams can be excluded from the decoding based on the quality measure.

9. The method of claim 8, wherein scheduling includes determining whether some streams can be excluded from the decoding based on the maximum number of iterations calculated for at least one stream.

10. The method of claim 1, wherein the plurality of streams are from satellite channels.

11. The method of claim 10, further including selecting the plurality of channels using a plurality of broadband tuners, wherein the number of such broadband tuners is less than the number of selected channels.

12. The method of claim 1, wherein the quality measure is signal to noise ratio (SNR).

13. The method of claim 12, wherein the stream having the highest SNR is decoded first.

14. The method of claim 1, wherein the quality measure is signal to noise and distortion ratio (SINAD).

15. The method of claim 1, wherein the quality measure is the ratio of signal to interference plus noise (SINR).

16. The method of claim 1, wherein the stream requiring the fewest decoder iterations is decoded first.

17. The method of claim 1, wherein channels with a quality measure that is below a predetermined threshold are not decoded.

18. A multi-channel iterative decoder for processing data from a plurality of channels, comprising:
   a) a number of iterative decoders, for accepting data and performing error correction decoding on the accepted data, the number being less than the number of channels;
   b) a controller for controlling the at least one iterative decoder; and
   c) an input module for determining a quality measure and communicating the quality measure to the controller in order to allow the controller to use the quality measure to assist in controlling the iterative decoder.

19. A multi-channel iterative decoder for processing data from more than one communication channel, comprising:
   a) at least one input buffer, the at least one buffer capable of storing data from at least one channel;
   b) a plurality of iterative decoders;
   c) an input module for determining a quality measure for each channel; and
   d) a controller coupled to the input module, the at least one input buffer and the plurality of decoders to schedule which channels are to be operated on by each decoder based upon the quality measure.

20. The multi-channel iterative decoder of claim 19 wherein the input module is included within the iterative decoder.

* * * * *